(12) United States Patent
Komatsu et al.

(10) Patent No.: US 6,613,443 B2
(45) Date of Patent: Sep. 2, 2003

(54) SILICON NITRIDE CERAMIC SUBSTRATE, SILICON NITRIDE CERAMIC CIRCUIT BOARD USING THE SUBSTRATE, AND METHOD OF MANUFACTURING THE SUBSTRATE

(75) Inventors: Michiyasu Komatsu, Yokohama (JP); Haruhiko Yamaguchi, Yokohama (JP); Takayuki Naba, Ibo-Gun (JP); Hideki Yamaguchi, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/983,935

(22) Filed: Oct. 26, 2001

(65) Prior Publication Data
US 2002/0084103 A1 Jul. 4, 2002

(30) Foreign Application Priority Data

| | | |
|---|---|---|
| Oct. 27, 2000 | (JP) | 2000-329499 |
| Dec. 25, 2000 | (JP) | 2000-393570 |
| Oct. 5, 2001 | (JP) | 2001-309457 |

(51) Int. Cl.[7] ............................................. H01L 23/06
(52) U.S. Cl. ................. 428/469; 428/698; 428/704; 438/718; 257/703; 257/705
(58) Field of Search ........................ 428/469, 698, 428/704; 438/718; 257/705, 703

(56) References Cited

U.S. PATENT DOCUMENTS 5,698,896 A * 12/1997 Komatsu et al. ............ 257/705
6,004,705 A * 12/1999 Masaki et al. ............... 430/15

FOREIGN PATENT DOCUMENTS

| | | | |
|---|---|---|---|
| JP | 56-13755 | * 2/1981 | ............ C03C/3/22 |
| JP | 1-230478 | 9/1989 | |
| JP | 9-69594 | 3/1997 | |
| JP | 9-69672 | 3/1997 | |
| JP | 2000-034172 | 2/2000 | |

* cited by examiner

Primary Examiner—Deborah Jones
Assistant Examiner—Vivek Koppikar
(74) Attorney, Agent, or Firm—Oblon, Spivak, McClelland, Maier & Neustadt, P.C.

(57) ABSTRACT

The present invention provides a silicon nitride ceramic substrate composed of a silicon nitride sintered body in which maximum size of pore existing in grain boundary phase of the sintered body is 0.3 μm or less, and having a thermal conductivity of 50 W/mK or more and a three point bending strength of 500 MPa or more, wherein a leak current is 1000 nA or less when an alternative voltage of 1.5 kV–100 Hz is applied to a portion between front and back surfaces of the silicon nitride sintered body under conditions of a temperature of 25° C. and a relative humidity of 70%. According to the above structure of the present invention, there can be provided a silicon nitride ceramic substrate capable of effectively suppressing a leak current generation when the above substrate is assembled into various power modules and circuit boards, and capable of greatly improving insulating property and operative reliability of power modules in which output power and capacity are greatly increased.

17 Claims, 1 Drawing Sheet

SILICON NITRIDE CERAMIC SUBSTRATE, SILICON NITRIDE CERAMIC CIRCUIT BOARD USING THE SUBSTRATE, AND METHOD OF MANUFACTURING THE SUBSTRATE

BACKGROUND OF THE INVENTION

1. Technical Field of the Invention

The present invention relates to a silicon nitride ceramic substrate, silicon nitride circuit board using the substrate and a method of manufacturing the substrate, and more particularly to a silicon nitride ceramic substrate and a method of manufacturing the same, capable of effectively suppressing a generation of leak current when the above silicon nitride ceramic substrate is assembled into various power modules and circuit boards, and capable of greatly improving insulating property and operative reliability of power modules in which output power and capacity are greatly increased.

2. Description of the Related Art

A ceramic sintered body containing silicon nitride as a main component has an excellent heat resistance in a high temperature environment of 1000° C. or more, and has excellent thermal-shock resistance because of its low thermal expansion coefficient. For this reason, as a structural material for high temperature which can be replaced with a conventional heat resistant super alloy, the ceramic sintered body is tried to be applied to various refractory heat-resistant parts such as gas turbine parts, engine parts, or mechanical parts for making steel. In addition, since the ceramic sintered body has high corrosion resistance to a metal, the ceramic sintered body is tried to be applied as a melt-resisting material for a molten metal. Since the ceramic sintered body has high abrasion resistance, the ceramic sintered body is also tried to be actually applied to a sliding member such as a bearing or a cutting tool.

Various sintering compositions for silicon nitride ceramic sintered bodies are known: such as silicon nitride/yttrium oxide/aluminum oxide system; silicon nitride/yttrium oxide/aluminum oxide/aluminum nitride system; and silicon nitride/yttrium oxide/aluminum oxide/oxide of titanium, magnesium or zirconium system.

The oxides of rare earth elements, such as yttrium oxide ($Y_2O_3$) in the sintering compositions listed above, have been widely used as sintering assistant agents. Such rare earth element oxides enhance the sintering characteristics of sintering materials and, therefore, achieve high density and high strength of the sintered bodies.

According to the conventional art, silicon nitride sintered bodies are generally mass-produced as follows. After a sintering assistant agent as mentioned above is added to the powder of silicon nitride, the material mixture is molded to form a compact by press-molding the mixture under a molding pressure of 80–100 MPa, or by molding the material mixture in accordance with an extrusion method or a Doctor-Blade method. Then, the compact is sintered in a sintering furnace at about 1600–1900° C. for a predetermined period of time followed by naturally cooling (self-cooling) the resultant sintered body in the furnace at a high cooling rate.

However, when various power modules were manufactured in such a manner that the silicon nitride sintered body prepared through the above conventional method was used as a ceramic substrate and a metal circuit plate was bonded to a surface of the ceramic substrate and a semiconductor chip was mounted on the metal circuit plate, since an electrical insulating property of the ceramic substrate was low and a dielectric loss became large, it was difficult to obtain a power module having a high reliability. Further, this tendency has been more remarkable in recent years in accordance with advance of the output power level and a degree of integration of the semiconductor element.

More concretely to say, when various power modules each having a high output power and a large capacity are formed by using the above silicon nitride ceramic substrates, the electrical insulating property between the front and rear surfaces of the ceramic substrate is disadvantageously lowered whereby a leak current is liable to be generated. Further, when the above leak current exceeds a predetermined value, a current flowing in the metal circuit plate leaks to another metal circuit through the ceramic substrate. Therefore, although the metal circuit plates are not electrically connected, the leak current flows to another metal circuit plate, so that there has been posed a problem to cause bad influences such that the semiconductor element takes place malfunction and the leak current damages parts constituting the various power modules.

Further, although the silicon nitride sintered body produced by the conventional method achieves high mechanical strengths such as toughness, the thermal conductivities thereof are significantly lower than those of aluminum nitride (AlN) sintered bodies, beryllium oxide (BeO) sintered bodies or silicon carbide (SiC) sintered bodies. Therefore, conventional silicon nitride sintered bodies are unsuitable for electronic materials, such as ceramic substrate for mounting semiconductor, that needs good heat-radiating characteristics. Accordingly, the use of silicon nitride sintered body is thus limited.

On the other hand, aluminum nitride sintered bodies have high thermal conductivity and low thermal expansion coefficient, compared with other ceramic sintered bodies. Therefore, aluminum nitride sintered bodies have been widely used as packaging materials or materials of circuit boards for semiconductor chips, which have been progressively improved in operational speed, output power, variety of functions and size. However, no conventional aluminum nitride sintered bodies achieve sufficiently high mechanical strengths. Therefore, there is a growing need and technical requirement for a ceramic sintered body having both high thermal conductivity and high strength.

To cope with the growing need described above, the inventor of this invention had developed a silicon nitride sintered body which is excellent in both mechanical strength and thermal conductivity. However, in the conventional silicon nitride sintered body, there was posed a problem such that a size of a pore existing in crystal grain boundary phase was liable to be large so as to provide a diameter of about 1 $\mu$m. Then, when a voltage is applied to the sintered body, there is posed a problem that the leak current is liable to cause via the pore portion. Accordingly, in such sintered body, there is posed a problem that the electrical insulating property is disadvantageously lowered, so that the sintered body cannot be sufficiently available as a substrate for mounting a semiconductor chip.

That is, when various power modules were manufactured in such a manner that the silicon nitride sintered body prepared through the above conventional method was used as a ceramic substrate and a metal circuit plate was bonded to a surface of the ceramic substrate and a semiconductor chip was mounted on the metal circuit plate, since an electrical insulating property of the ceramic substrate was low and a dielectric loss became large, it was difficult to obtain a power module having a high reliability. Further, this tendency has been more remarkable in recent years in accordance with advance of the output power level and a degree of integration of the semiconductor element.

More concretely to say, when various power modules each having a high output power and a large capacity are formed by using the above silicon nitride ceramic substrates, the electrical insulating property between the front and rear surfaces of the ceramic substrate is disadvantageously lowered whereby a leak current is liable to be generated. Further, when the above leak current exceeds a predetermined value, a current flowing in the metal circuit plate leaks to another metal circuit through the ceramic substrate. Therefore, although the metal circuit plates are not electrically connected, the leak current flows to another metal circuit plate, so that there has been posed a problem to cause bad influences such that the semiconductor element takes place malfunction and the leak current damages parts constituting the various power modules.

SUMMARY OF THE INVENTION

The present invention had been achieved for solving the aforementioned problems. Accordingly, an object of the present invention is to provide a silicon nitride ceramic substrate, silicon nitride ceramic circuit board using the substrate and a method of manufacturing the substrate having a high electronic insulating property capable of effectively suppressing generation of a leak current, and having a high thermal conductivity and an excellent heat radiating property in addition to high strength property which is inherent to the silicon nitride sintered body.

In order to attain the objects described above, the inventors of the present invention had investigated causes and factors to generate the leak current in the module formed by using the conventional silicon nitride ceramic substrate. As a result, the inventors had obtained the following findings.

That is, since a sintering property of the conventional silicon nitride sintered body constituting the substrate was poor, a number of cracks such as micro-crack having a width of 1 $\mu$m or more and sub-micron crack having a width of less than 1 $\mu$m are liable to form on a surface of the conventional silicon nitride sintered body. In a case where the crack is developed in a thickness direction of the substrate, a thickness of the ceramic substrate is disadvantageously lowered in an amount corresponding to a length of the crack. Therefore, a substantial thickness of the ceramic substrate as an insulating material is decreased thereby to lower the insulating property, so that the leak current is liable to occur when the module is formed by using the substrate. In this regard, the above cracks are also liable to occur when the ceramic sintered body is subjected to a grinding work so as to provide a predetermined thickness.

Accordingly, in order to suppress the generation of the leak current, it is one important factor to take a molding method, in which a thickness-control by the grinding work is not performed, into consideration. However, particularly when a molding pressure for forming a molded compact by press-molding a material mixture was set to 120 MPa or more, there could be obtained knowledge and a finding that a dense sintered body having less crack generation was obtained thereby to effectively decrease the generation of the leak current.

Further, the silicon nitride crystal grain is primarily an electrically insulating material, so that a current would not flow in the grain. However, in an actual silicon nitride ceramic substrate, a glass phase composed of composite oxides of sintering agents is formed as a grain boundary phase. It was confirmed that the glass phase formed in the grain boundary phase was one factor to cause the above current leaking phenomena.

Furthermore, it was also found that the glass phase has a high heat resistance thereby to easily lower thermal conductivity of the silicon nitride ceramic substrate, and when a large amount of the glass phase is formed, the cracks are liable to occur. Note, the above grain boundary phase is necessary to secure and maintain the strength of the silicon nitride ceramic substrate to some extent. However, the existing the grain boundary would form a substrate structure easily generating the leak current. Therefore, in the present invention, there is formed a grain boundary phase hardly causing the leak current and having a high thermal conductivity.

Concretely to say, at least part of the grain boundary phase is crystallized and a ratio of the glass phase having a high thermal resistance is decreased, so that the thermal conductivity of the silicon nitride ceramic substrate is increased to be 50 W/mK or more, simultaneously, the generation of the leak current is effectively prevented.

Further, it was also confirmed that an addition of Hf oxide at a predetermined mount made it possible to suppress the generation of the above glass phase and to easily advance the crystallization of the grain boundary, so that the addition of the Hf oxide was proved to be effective for the substrate in view of both increase of the thermal conductivity and the suppression of the leak current.

Further, it was also confirmed that a residual carbon remained in the silicon nitride ceramic substrate after the sintering operation was one factor for generating the leak current because carbon has an electrical conductivity. As a countermeasure to this factor, when the residual carbon content remained in the molded compact formed by molding the material mixture and thereafter degreasing the molded compact is specified to a predetermined value or less, the leak current value of the silicon nitride ceramic substrate could be effectively lowered.

Further, the present inventor studied the effects and influences of the types of silicon nitride powder, sintering assistant agent and additives, the amounts thereof, and the sintering conditions on the characteristics of the final products, that is, the sintered bodies, by performing experiments.

As the results, the experiments provided the following findings. That is, a silicon nitride sintered body having both high strength and high thermal conductivity can be obtained by: adding certain amounts of a rare earth element to a highly-pure fine powder of silicon nitride to prepare a material mixture; molding the material mixture to form a compact and degreasing the compact: maintaining the compact at a predetermined high temperature for a certain period of time, thereafter, to sinter the compact so as to enhance the density thereof; and then moderately cooling the sintered body at a certain cooling rate.

Further, the following acknowledgement could be obtained. That is, formation of a glass phase (amorphous phase) in the grain boundary phase is effectively suppressed by using a highly pure powder of silicon nitride containing reduced amounts of oxygen and impurity cationic elements, and preparing a silicon nitride molded compact having a reduced thickness before sintering. Thereby, a silicon nitride sintered body having a high thermal conductivity of 50 W/m·K or higher, more preferably, 90 W/m·K or higher can be obtained even if only an oxide of rare earth element is added to a silicon nitride material powder.

If a sintered body in a sintering furnace is cooled by switching off a heating power source of the furnace as performed according to the conventional producing method, the cooling rate was rather high and rapid, that is, about 400–800° C. per hour. However, an experiment performed by the present inventors provided the following findings. That is, the grain boundary phase in the structure of a silicon nitride sintered body is changed from an amorphous phase to a phase including crystal phases by moderately cooling the sintered body at a rate of 100° C. per hour or lower while controlling the cooling rate, thereby achieving both high strength and high thermal conductivity.

However, the present inventor improved and studied the silicon nitride sintered body to provide the following findings. That is, when the silicon nitride sintered body contains 0.3 to 3.0% by weight (mass %) of magnesium (Mg) in terms of the amount of an oxide thereof in addition to a rare earth element, the sintering characteristic can be further improved thereby to further increase the strength of the sintered body, so that the present invention has been achieved. For example, even in a case where the material compact is sintered at a temperature range of 1500–1900° C. to form a ceramic substrate, there can be obtained a silicon nitride ceramic substrate having a leak current of 1000 nA or less, preferably 500 nA or less when alternative voltage of 1.5 kV-100 Hz is applied to the substrate, or having a dielectric loss of 0.0001 or less when alternative voltage of 1 MHz is applied thereto. In addition, this silicon nitride ceramic substrate can attain to a bending strength of 500 MPa or more and a high thermal conductivity 50 W/mK or more.

Furthermore, it was confirmed that there could be obtained a silicon nitride ceramic substrate having a high insulating property, particularly capable of suppressing the leak current generated at a time of applying the voltage to the substrate when a predetermined amount of oxide of rare earth element, if necessary, magnesia (MgO), Hf compound, at least one compound selected from the group consisting of oxides, carbides, nitrides, silicides and borides of Ti, Zr, W, Mo, Ta, Nb, Ta, V and Cr, are added to fine silicon nitride material powder thereby to prepare a material mixture, then molding the material mixture to form a compact, followed by degreasing the compact, maintaining the compact under predetermined heating conditions and atmospheric conditions on the way to the sintering step thereby to conduct a deoxidization treatment (treatment for reducing oxygen concentration), followed by sintering the compact to form a sintered body and moderately cooling the sintered body at a cooling rate of at most 100° C. per hour until the temperature is reduced to a point at which a liquid phase formed by the rare earth element or the like during the sintering step solidifies.

The present invention had been achieved on the basis of the aforementioned findings.

That is, according to the present invention, there is provided a silicon nitride ceramic substrate composed of a silicon nitride sintered body in which a maximum size of pore existing in grain boundary phase of the sintered body is 0.3 μm or less, and having a thermal conductivity of 50 W/mK or more and a three point bending strength of 500 MPa or more, wherein a leak current is 1000 nA or less when an alternative voltage of 1.5 kV–100 Hz is applied to a portion between front and back surfaces of the silicon nitride sintered body under conditions of a temperature of 25° C. and a relative humidity of 70%.

Further, in the above silicon nitride ceramic substrate, it is preferable that the silicon nitride ceramic substrate has a fracture toughness of 6.5 MPa·m$^{1/2}$ or more.

Furthermore, in the above silicon nitride ceramic substrate, it is preferable that the silicon nitride ceramic substrate comprises a silicon nitride crystal phase and a grain boundary phase, and having a ratio of a crystal compound phase formed in the grain boundary phase to the entire grain boundary phase of at least 20%. In addition, it is also preferable that the silicon nitride ceramic substrate contains 2.0 to 17.5% by weight of a rare earth element in terms of the amount of an oxide thereof.

Furthermore, it is also preferable that the silicon nitride ceramic substrate has a thickness of 1.5 mm or less. In addition, it is also preferable that the silicon nitride ceramic substrate has a thermal conductivity of 90 W/mK or more.

Furthermore, it is also preferable that the silicon nitride ceramic substrate contains 0.3 to 3.0% by weight of Mg in terms of the amount of MgO.

Furthermore, it is also preferable that the silicon nitride ceramic substrate contains 0.3 to 3.0% by weight of at least one of Hf and Mg in terms of the amount of oxide thereof, and at most 0.5% by weight of Al, Li, Na, K, Fe, Ba, Mn and B as impurity cationic elements in terms of total amount thereof.

Furthermore, it is also preferable that a residual carbon content in the silicon nitride ceramic substrate is 500 ppm or less. In this regard, a residual carbon content (amount of residual carbon) specified in the present invention does not include an amount of metal carbide but denotes a content of carbon as single substance remained in the silicon nitride ceramic substrate.

Further, in the above ceramic substrate, it is also preferable that the silicon nitride ceramic substrate has a porosity in terms of volumetric ratio of 2.5% or less, and a total oxygen content is 3.5% by weight or less. In addition, it is also preferable that the silicon nitride ceramic substrate contains at most 2% by weight of at least one element selected from the group consisting of Ti, Zr, W, Mo, Ta, Nb, V and Cr in terms of oxide thereof.

Furthermore, a silicon nitride ceramic circuit board according to the present invention comprises: the silicon nitride ceramic substrate prepared as above; and a metal circuit plate provided on the silicon nitride ceramic substrate.

Further, a method of manufacturing a silicon nitride ceramic substrate according to the present invention comprises the steps of: preparing a material mixture by adding 2.0 to 17.5% by weight of a rare earth element in terms of the amount of an oxide thereof to a silicon nitride powder; molding the material mixture to form a compact; degreasing the compact; heating and holding the compact at a temperature of 1,300–1,600° C. for a predetermined period of time on the way to a sintering step; sintering the compact at a temperature of 1,700–1,900° C. thereby to form a sintered body; and moderately cooling the sintered body at a cooling rate of at most 100° C. per hour until the temperature is reduced to a point at which a liquid phase formed by the rare earth element during the sintering step solidifies.

Further, in the above method of manufacturing a silicon nitride ceramic substrate, it is preferable that the silicon nitride powder contains at most 1.5% by weight of oxygen, at most 0.5% by weight of Al, Li, Na, K, Fe, Ba, Mn and B as impurity cationic elements in terms of total amount thereof, and 75 to 97% by weight of alpha-phase type silicon nitride, and which has an average grain size of at most 1.0 μm.

Furthermore, in the above method of manufacturing a silicon nitride ceramic substrate, it is also preferable that 0.3 to 3.0% by weight of at least one of Hf and Mg in terms of oxide thereof is added to the silicon nitride powder. In addition, it is also preferable that at most 2% by weight of at least one element selected from the group consisting of Ti, Zr, W, Mo, Ta, Nb, V and Cr in terms of oxide thereof is added to the silicon nitride powder.

Furthermore, in the above manufacturing method, it is also preferable that the material mixture is molded at a molding pressure of 120 MPa or more thereby to form the compact. In addition, it is also preferable that the molding pressure is within a range of 120–200 MPa. Further, it is also preferable a residual carbon content remained in the silicon nitride sintered body after completion of the sintering step is 500 ppm or less.

According to the manufacturing method described above, there can be provided a silicon nitride ceramic substrate excellent in both mechanical characteristics and thermal conductive characteristics, the substrate being composed of a silicon nitride sintered body in which a leak current is 1000 nA or less when an alternative voltage of 1.5 kV–100 Hz is applied to a portion between front and back surfaces of the silicon nitride sintered body under conditions of a temperature of 25° C. and a relative humidity of 70%, a total oxygen content is preferably 3.5 wt % or less, a grain boundary phase containing rare earth element or the like is formed in silicon nitride crystal structure and a maximum size of pore existing in the grain boundary phase is 0.3 $\mu$m or less, and the sintered body having a porosity of 2.5% or less, a thermal conductivity of 50 W/mK or more, a three point bending strength of 500 MPa or more at room temperature, and preferably having a fracture toughness of 6.5 MPa·m$^{1/2}$ or more.

The above leak current is measured in accordance with the following manner. Namely, a metal electrode is bonded to both front and back surfaces of the silicon nitride ceramic substrate, respectively. An alternative voltage of 1.5 kV–100 Hz is applied to a portion between the pair of metal electrodes bonded to the front and back surfaces of the silicon nitride sintered body. At this time, a value of the leak current flowing between the metal electrodes can be measured by means of a curve-tracer or the like.

When the leak current exceeds 1000 nA, the insulating property of the substrate per se is insufficient, so that the substrate becomes unsuitable as a ceramic substrate for forming a high powered module having a high integration degree and a high capacity. A preferable range of the leak current is 500 nA or less.

In this connection, in order to clearly specify the above leak current value, the measuring conditions were standardized in the present invention so that the measuring temperature was set to 25° C. while the relative humidity of the measuring atmosphere was set to 70%. Since the value of the leak current varies to some extent in accordance with the measuring temperature and the humidity, the measuring conditions were specified as above. In this regard, since the measuring conditions were merely specified in the present invention, it goes without saying that the silicon nitride ceramic substrate can be also used under another condition other than the above measuring conditions.

To achieve good sintering characteristics of high strength and high thermal conductivity of the product, the silicon nitride fine powder which is used in the method of the invention and contained as a main component in the sintered body constituting the ceramic substrate of the invention preferably contains at most 1.5%, preferably, 0.5–1.2%, by weight of oxygen, at most 0.5%, preferably, 0.3% or less, by weight of Li, Na, K, Fe, Ba, Mn and B as impurity cationic elements in terms of total amount thereof, and 75–97%, more preferably, 80–95%, by weight of alpha-phase type silicon nitride, and, further the powder has fine grains, that is, an average grain size of at most 1.0 $\mu$m, more preferably about 0.4–0.8 $\mu$m.

In this connection, as the silicon nitride material powder, two types of $\alpha$-type $Si_3N_4$ powder and $\beta$-type $Si_3N_4$ powder have been known. However, when a sintered body is formed from the $\alpha$-type $Si_3N_4$ powder, there is a tendency that a strength is liable to be insufficient. In contrast, in case of the $\beta$-type $Si_3N_4$ powder, although a high temperature is required for the sintering operation, there can be obtained a sintered body having a high strength and a structure in which a number of silicon nitride fibers each having a large aspect ratio are tangled in a complicate manner. Therefore, in the present invention, it is preferable to sinter $\alpha$-type $Si_3N_4$ material powder at a high temperature, and to convert into $\beta$-type $Si_3N_4$ sintered body.

A reason why a blending amount of $\alpha$-type $Si_3N_4$ powder is limited to a range of 75–97 wt % (mass %) is as follows. That is, when the amount is set to a range of 75 wt % or more, a bending strength, thermal conductivity and insulating property of the $Si_3N_4$ sintered body are greatly increased thereby to further improve the excellent characteristics of the silicon nitride. On the other hand, the amount is limited to at most 97 wt % in view of the sintering property. It is more preferable to set the range to 80–95 wt %.

To achieve good sintering characteristics of high strength, high thermal conductivity, and insulating property of the product, as a starting material powder of the silicon nitride, it is preferable to use the silicon nitride fine powder containing at most 1.5%, preferably, 0.5–1.2% by weight of oxygen, and at least 90%, more preferably, at least 90%, by weight of alpha-phase type silicon nitride, and further the powder has fine grains, that is, an average grain size of at most 1.0 $\mu$m, more preferably about 0.4–0.8 $\mu$m.

The use of a fine powder of silicon nitride having an average grain size of 1.0 $\mu$m or less facilitates forming a dense sintered body having a porosity of at most 2.5% by volume without requiring a large amount of a sintering assistant agent, and therefore reduces the potential adverse effect of a sintering assistant agent on the thermal conductivity of the sintered body.

A total oxygen content contained in the silicon nitride ceramic substrate of the present invention is preferably set to 3.5 wt % or less. When the total oxygen content in the substrate exceeds 3.5 wt %, a maximum size of the pore formed in the grain boundary phase is disadvantageously increased, and particularly, the leak current is increased thereby to lower the insulating property of the sintered body. A preferable range is 2.5 wt % or less.

Further, a maximum size of pore existing in the grain boundary phase of the silicon nitride ceramic substrate according to the present invention is specified to be 0.3 $\mu$m or less. When the maximum size of pore exceeds 0.3 $\mu$m, particularly, the leak current is increased thereby to lower the insulating property of the sintered body. A preferable range is 0.2 $\mu$m or less.

The total amount of the impurity cationic elements contained in the silicon nitride ceramic substrate, that is, Al, Li, Na, K, Fe, Ba, Mn and B, is limited to at most 0.5% by weight in order to ensure the thermal conductivity of at least 50 W/mK, because the impurity cationic elements adversely affect the thermal conductivity of the substrate. In particular, for the same reason described above, the total amount of the impurity cationic elements is more preferably set to be at most 0.3% by weight. In this case, since the silicon nitride powder used to obtain an ordinary silicon nitride sintered body contains relatively large amounts of Fe and Al, a total amount of Fe and Al is used as a criteria for the total amount of impurity cationic elements.

The use of a silicon nitride powder containing at least 90% by weight of alpha-phase type silicon nitride, which has better sintering characteristics than a beta-phase type, facilitates producing a high-density sintered body.

Examples of the rare earth element to be added as a sintering assistant agent to a silicon nitride powder are Y, Ho, Er, Yb, La, Sc, Pr, Ce, Nd, Dy, Sm and Gd. Such a rare earth element may be added to the silicon nitride powder in the form of an oxide thereof or a substance which is changed into an oxide thereof during the sintering process. Two or more kinds of such oxide or substance may be added to the silicon nitride powder. Such a sintering assistant agent reacts with the silicon nitride powder so as to form a liquid phase and thereby serves as a sintering promoter.

The amount of a sintering assistant agent to be contained in the material powder is set to be within a range of from 2.0% to 17.5% or less by weight in terms of the amount of an oxide thereof. If the amount is less than 2.0% by weight, the sintered body fails to achieve a sufficiently high density and high thermal conductivity. In particular, when an element which has a large atomic weight like lanthanoid is used as the rare earth element at above less amount, a sintered body having relatively low strength and relatively low thermal conductivity is formed.

On the other hand, if the amount is more than 17.5% by weight, an excessively large portion of the grain boundary phase is formed, thereby reducing the thermal conductivity and strength of the sintered body. For this reason, the amount of a sintering assistant agent is within the range described above. For the same reason described above, the more preferred range of the amount of a sintering assistant agent is 3 to 15% by weight.

In the present invention, an oxide (MgO) of magnesium (Mg) to be used as an optional addition component promotes a function of the above rare earth element as sintering promoter thereby to enable the sintered body to be densified at a low temperature range. In addition, magnesium oxide (MgO) has a function of controlling a grain growth in the crystal structure of the sintered body thereby to increase the mechanical strength of $Si_3N_4$ sintered body.

If the addition amount of Mg is less than 0.3% by weight in terms of an oxide thereof, the sintered body fails to achieve a sufficiently addition effect. If the amount is greater than 3.0% by weight, the thermal conductivity of the sintered body is reduced. For this reason, the preferred range of the amount of magnesium oxide is set to 0.3–3.0% by weight, preferably, 0.5–2% by weight.

In the above $Si_3N_4$ ceramic substrate, Hf compound, which exhibits the same effect as the above MgO may also be added as an optional component at a predetermined amount. Hf component is added as oxides, carbides, nitrides, silicides and borides. When Hf is added together with MgO, these compounds promote a sintering operation and effectively reduce the glass phase, thereby to improve thermal conductivity and mechanical strength of the $Si_3N_4$ sintered body.

The addition amount of Hf is 0.3–3 wt %, more preferably 1.0–2.5 wt % in terms of an oxide thereof. Since MgO and Hf compound have the same effect, when both MgO and Hf compound are added together, a synergistic effect can be also obtained.

Further, in the present invention, Ti, Zr, V, Nb, Ta, Cr, Mo and W may also be added as another optional components at a predetermined amount. These elements to be used as another addition component are added to the substrate as oxides, carbides, nitrides, silicides and borides thereof. These compounds promote the sintering assistant effect of the rare earth element, and promote dispersion thereof in the crystal structure so as to enhance the mechanical strength of the silicon nitride ($Si_3N_4$) sintered body. Among them, compounds of Ti and Mo are particularly preferred.

If the amount of these compounds contained is less than 0.1% by weight, the substrate fails to achieve a sufficiently addition effect. If the amount is greater than 2% by weight, the thermal conductivity, mechanical strength and electrical breakdown strength of the substrate are reduced. For this reason, the preferred range of the amount of these compounds contained is 0.1–2% by weight. In particular, the amount is more preferably set to a range of 0.2–1.0% by weight.

The above compounds such as Ti and Mo or the like also serve as light blocking agents (light shielding agents). More specifically, they color the silicon nitride ceramic substrate black and thus provides it with an opacity. For this reason, a circuit board on which an integrated circuit or the like which tends to malfunction when exposed to light is packaged is to be manufactured, the compounds of Ti and the like are preferably added to the silicon nitride powder so as to form a silicon nitride ceramic substrate having excellent light blocking characteristics.

Since the porosity of the ceramic substrate significantly affects the generation amount of the leak current, the thermal conductivity and strength of the substrate, so that the porosity is preferably set to 2.5 vol % or less. If the porosity is greater than 2.5% by volume, the leak current is remarkably increased and the ceramic substrate fails to achieve the high thermal conductivity, and the insulating property, the thermal conductivity and the mechanical strength of the ceramic substrate are reduced to undesired levels.

Although a silicon nitride ceramic substrate is structurally constituted by a silicon nitride crystal phase and a grain boundary phase, the ratio of the crystal compound phase to the grain boundary phase significantly affects the generation amount of the leak current and the thermal conductivity of the ceramic substrate. In the high thermal conductive silicon nitride sintered body used in the present invention, the ratio of the crystal compound phase to the grain boundary phase is preferably set to 20% or higher, more preferably, 50% or higher. If the ratio is less than 20%, the ceramic substrate fails to achieve a high thermal conductivity of at least 50 W/mK and, therefore, a ceramic substrate having less leak current, good heat-radiating characteristics and a desirable high-temperature strength cannot be obtained.

In particular, the silicon nitride crystal grain per se constituting the silicon nitride sintered body is an electronically insulating substance, so that a state of the grain boundary phase has a great influence on the leak current value of the silicon nitride sintered body.

To ensure that the porosity of the silicon nitride sintered body is limited to at most 2.5% by volume and a maximum size of the pore existing in the grain boundary phase formed in the silicon nitride crystal structure is 0.3 µm or less, and in order to obtain a silicon nitride sintered body having a thermal conductivity of 50 W/mK or more, a total oxygen content of 3.5 wt % or less and a leak current of 1000 nA or less, it is important that a silicon nitride molded compact prepared from the above material is degreased, followed by holding the compact at a temperature of 1300–600° C. for 0.5–3 hours on the way to a sintering step, followed by sintering the compact by normal-pressure-sintering method or pressured-sintering method at temperature of 1,700–1,900° C. for about 2–10 hours immediately followed by moderately cooling the sintered body at a cooling rate of 100° C. per hour or slower. As the pressured-sintering method, various press-sintering methods such as a pressurized-atmosphere sintering method, hot-pressing method, HIP (hot isostatic pressing) method or the like can be utilized.

In particular, by holding the molded compact at a temperature of 1300–600° C. for 0.5–3 hours on the way to a sintering step, an oxygen concentration in the generated liquid phase (grain boundary phase) is reduced thereby to rise a melting point of the liquid phase, so that the generation of bubble-shaped pore, which is caused when the liquid phase melts, can be suppressed. Simultaneously, the maximum size of the pore is minimized to be fine, so that it becomes possible to improve the leak current value of the sintered body. Although the above holding operation of the compact on the way to the sintering step exhibits a remarkable effect when the compact is subjected to the treatment in vacuum atmosphere at temperature of 1350–1450° C., almost the same effect can be also obtained when the compact is subjected to the treatment in nitrogen atmosphere at temperature of 1500–1600° C.

In addition, when the sintered body is moderately cooled at the cooling rate of 100° C. per hour or slower in a temperature range from the sintering temperature to a temperature at which the liquid phase solidifies, the reduction of the oxygen concentration in the liquid phase is further promoted, so that there can be obtained a sintered body in which the leak current is suppressed and the insulating property is improved.

If the sintering temperature is lower than 1,700° C., the sintered body fails to achieve a sufficiently high density; more specifically, the porosity becomes greater than 2.5 vol %, thereby reducing the insulating property, the mechanical strength and thermal conductivity of the sintered body to undesired levels. On the other hand, if the sintering temperature is higher than 1,900° C., the silicon nitride component per se becomes likely to evaporate or decompose. In particular, if pressured-sintering process is not performed but the sintering process is performed under the normal pressure, the decomposition and evaporation of the silicon nitride component may occur at about 1,800° C.

The rate of cooling a sintered body immediately upon completion of the sintering operation is an important control factor to achieve crystallization of the grain boundary phase. If the sintered body is rapidly cooled at a cooling rate higher than 100° C. per hour, the grain boundary phase of the sintered body structure becomes an amorphous phase (glass phase) and, therefore, the ratio of a crystal phase formed of the liquid phase to the entire grain boundary phase becomes less than 20%. Thereby, the leak current is disadvantageously increased, and particularly, a further improvement in thermal conductivity of the sintered body cannot be expected.

The sufficiently broad temperature range in which the cooling rate must be precisely controlled is from a predetermined sintering temperature (1,700–1,900° C.) to the solidifying point of the liquid phase formed by the reaction of the sintering assistant agent as described above. The liquid phase solidifies at about 1,600–1,500° C. if the sintering assistant agent as described above is used. By maintaining the cooling rate at 100° C. per hour or slower, preferably, 50° C. per hour or slower, more preferably, 25° C. per hour or slower, at least in a temperature range from the above sintering temperature to the solidifying point of the liquid phase, the total oxygen content of the sintered body is 3.5 wt % or less, the maximum size of the pore is 0.3 μm or less, and porosity becomes 2.5% or less, and 20% or more, preferably, 50% or more, of the grain boundary becomes a crystal phase, thus achieving a silicon nitride sintered body having a high mechanical strength, a high thermal conductivity and less leak current value.

In this connection, the slower cooling rate for the above sintered body is more effective to crystallize the grain boundary phase. However, when the above cooling rate is excessively small, the manufacturing time of the ceramic substrate is disadvantageously prolonged. Therefore, a lower limit of the cooling rate is preferably set to 10° C. per hour.

By the way, the term "total oxygen content" specified in the present invention denotes a total amount in terms of wt % (mass %) of oxygen constituting the silicon nitride sintered body. Accordingly, when the oxygen exists in the silicon nitride sintered body as compounds such as metal oxide, oxidized nitride or the like, the total oxygen content is not an amount of the metal oxide (and oxidized nitride) but an amount of oxygen in the metal oxide (and the oxidized nitride).

A silicon nitride ceramic substrate according to the present invention can be produced by, for example, the following processes. A material mixture is prepared by adding predetermined amount of a sintering assistant agent, a required additive, such as an organic binder, and a compound of Ti or the like, to a fine powder of silicon nitride which has a predetermined fine average grain size and contains very small amount of impurities. The material mixture is then molded into a compact having a predetermined shape. As a method of molding the material mixture, a conventional sheet molding method, such as the die-press method or the doctor-blade method can be applied.

In a case where the molded compact is prepared through the above press-molding method, in order to particularly form a grain boundary hardly causing the leak current, it is preferable to set the molding pressure for the material mixture to 120 MPa or more. When the molding pressure is less than 120 MPa, there are easily formed portions to which rare earth element to be a component mainly constituting the grain boundary is agglomerated, and the compact cannot be sufficiently densified, so that there is obtained a ceramic substrate with many crack-formations.

Further, the above agglomerated portion of the grain boundary allows the leak current to easily flow, thus increasing the leak current value. Furthermore, even if a molded compact of which densification is insufficient is sintered, cracks are liable to occur, and the leak current is disadvantageously increased due to the cracks formed to the substrate. On the other hand, when the molding pressure is set to an excessively large value so as to exceed 200 MPa, a durability of the molding die is disadvantageously lowered.

In addition, when the molding pressure is excessively high, the compact becomes harder than a required level of hardness, so that it becomes difficult to discharge bubbles (voids), that are formed in the molded compact, to outside. Therefore, the above molding pressure is preferably set to a range of 120–200 MPa.

On the other hand, in a case where a silicon nitride ceramic substrate having a predetermined thickness is manufactured by controlling the thickness through a grinding work for a material sintered body, the cracks are liable to cause on a surface of the substrate due to an impact force applied to the sintered body during the grinding work.

Therefore, a method, in which a thin molded compact so as to provide a silicon nitride ceramic substrate having a thickness of 1.5 mm or less is prepared at a stage of the molding step and a grinding work after the sintering step is not performed, is also effective in view of preventing the generation of the cracks. Furthermore, when the molded compact is prepared to be thin, the oxygen concentration is effectively reduced by the holding operation performed on the way to the sintering step for the compact whereby the pore size can be minimized.

Concretely to say, there can be adopted a method in which a thin sheet-shaped molded body is prepared by using an extrusion method or Doctor-blade method, then the thin sheet-shaped molded body is subjected to only degreasing and sintering treatment thereby to manufacture a silicon nitride sintered body having a predetermined thickness. Even in this case, in order to remove a separating powder adhered to the sheet-shaped sintered body; a mild honing treatment may be performed. However, it is preferable not to adopt a grinding method providing so high impact as to generate the cracks. As a condition for the mild honing treatment, a pressure for blasting abrasive grain (abrasive grain injection pressure) is proposed to be 0.5 Mpa or less.

After the above molding process, the molding compact is heated and maintained at 600–800° C. for 1–2 hours in a non-oxidizing atmosphere or at 400–500° C. for 1–2 hours in the air, thereby degreasing the compact, that is, thoroughly removing the organic binder component added in the material mixture preparing process.

In this connection, in order to form a grain boundary which hardly cause the leak current, it is effective to sufficiently remove the carbon content at the degreasing treatment so that the residual carbon content originated from the organic binder used for forming the molded compact is reduced to be 500 ppm or less.

In general, a carbon has an electric conductivity, so that when the residual carbon content remained in the ceramic sintered body after completion of the sintering operation exceeds 500 ppm, the leak current is liable to increase. Therefore, it is an ideal that the carbon component should not be contained in the molded compact from the beginning. However, in actual, if the organic substance (organic binder) is not added to the material mixture, a shape-holding property and a handling property of the molded compact are disadvantageously lowered. Therefore, in order to reduce the residual carbon content, the above degreasing step is provided in the present invention.

However, unless the molded compact is subjected to a special treatment, it is difficult to completely remove the carbon content. In addition, also the residual carbon reacts with silicon nitride and additives such as the sintering agent at the sintering operation thereby to forms stable carbide, so that it is difficult to completely remove the residual carbon. However, when a sufficient degreasing treatment is performed such that the residual carbon content remained in the sintered ceramic substrate is reduced to 500 ppm or less, the generation of the above leak current can be effectively prevented.

In particular, in a thin ceramic substrate having a thickness of 1 mm or less, further 0.7 mm or less, a large amount of residual carbon will give an adverse effect on the leak current, so that it is preferable to control the residual carbon content.

On the way to the sintering step, after a pressure in a sintering furnace is reduced, the degreased compact is heated and held at a temperature of 1300–1600° C. for 0.5–3 hours, then sintered by normal-pressure-sintering method or pressured-sintering method at a temperature of 1,700–1,900° C. in a sintering atmosphere of an inert gas, such as nitrogen gas, hydrogen gas, or argon gas.

The silicon nitride sintered body produced by the above method achieves a total oxygen content of 3.5 wt % or less, a porosity of 2.5% or less, a maximum pore size of 0.3 $\mu$m or less, a thermal conductivity of 50 W/m·K (at 25° C.) or greater, and good mechanical characteristics, that is, a three-point bending strength of 500 MPa or greater.

Further, there can be also obtained a high thermal conductive silicon nitride sintered body having a thermal conductivity of 90 W/m·K or greater.

Further, according to the above molding method, the molded compact is densified from the stage of the molding step, so that silicon nitride ceramic substrate having less crack formation can be obtained. On the surface of the ceramic substrate composed of the silicon nitride sintered body in which the molding property and the sintering property have been improved, any micro-crack having a width of 1 $\mu$m or more is not generated at all, and it is also possible to greatly reduce the amount of sub-micron cracks each having a width of less than 1 $\mu$m. Concretely to say, the number of sub-micron cracks to be generated in a unit area of 10 $\mu$m×10 $\mu$m on a surface structure of the substrate is 2 or less.

According to the silicon nitride ceramic substrate and the manufacturing the same of the present invention, the ceramic substrate is manufactured in such a manner that the molded compact is subjected to a predetermined holding treatment on the way to the sintering step, thereafter sintered, so that the oxygen content in the sintered body is reduced and the generation of the pore is suppressed thereby to enable the maximum pore size to be extremely small. Therefore, there can be obtained a silicon nitride ceramic substrate having a high insulating property and less leak current formation.

Further, when the molded compact is prepared by molding the material mixture at a molding pressure of 120 MPa or more, the cracks to be generated on the substrate can be greatly decreased, so that there can be obtained a silicon nitride ceramic substrate having a high insulating property and less leak current formation.

Therefore, in a case where a power module is manufactured by using the above silicon nitride ceramic substrate, even if the output power and the capacity of the module are increased, there can be formed a power module having a high insulating property and a high reliability in operative function.

In a case where the above silicon nitride ceramic substrate is used for the power module or a circuit board, a metal circuit plate is necessary to be integrally bonded onto the ceramic substrate. As the metal circuit plate, it is preferable to use metals or alloys thereof having a high electric conductivity, such as copper, aluminum or alloys thereof (copper alloy, Al alloy) or the like. As a method of bonding the metal circuit plate, various methods such as a direct bonding copper method, active metal brazing method or the like can be applied.

BRIEF DESCRIPTION OF THE DRAWINGS

Other objects and aspects of the present invention will become more apparent from the following description of embodiments with reference to the accompanying drawings in which.

DETAILED DESCRIPTION OF THE PREFERRED EMBODIMENTS

Figure 1:
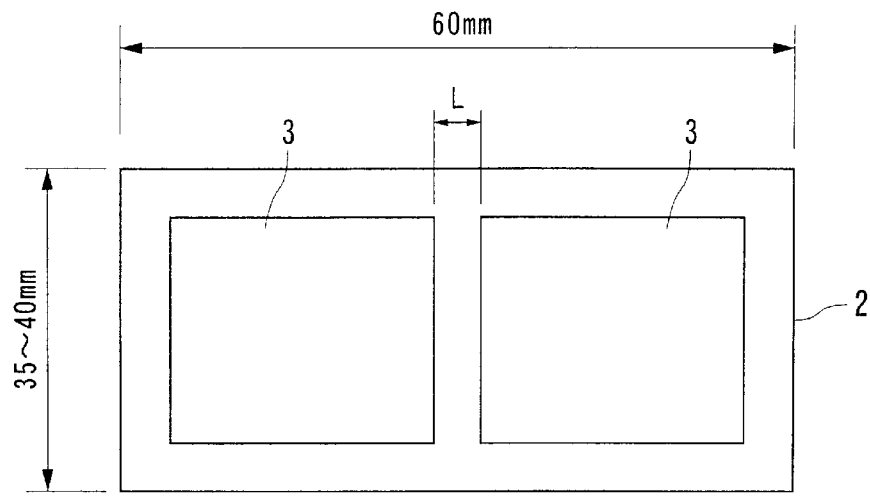
FIG. 1 is a plan view showing a silicon nitride ceramic circuit board using a silicon nitride ceramic substrate according to one embodiment of the present invention.

Next, preferred embodiments of the silicon nitride ceramic substrate according to the present invention will be explained more concretely on the basis of the following Examples and Comparative Examples.

EXAMPLES 1–4

A material powder mixture for Examples 1–4 was prepared by adding 10 wt % of $Y_2O_3$ (yttrium oxide) powder having an average grain size of 0.9 μm, 2 wt % of MgO (magnesium oxide) powder having an average grain size of 0.5 μm and 2 wt % of $HfO_2$ (hafnium oxide) powder having an average grain size of 1.0 μm, as a sintering assistant agent, to $Si_3N_4$ (silicon nitride) material powder containing 1.1 wt % of oxygen, total 0.10 wt % of Al, Li, Na, K, Fe, Ba, Mn and B as impurity cationic elements and 97 wt % of α-phase silicon nitride, and having an average grain size of 0.55 μm, followed by wet-mixing the materials in ethyl alcohol for 96 hours using pulverizing balls as pulverization media formed of silicon nitride, and drying the mixture, thereby to prepare a material powder mixture.

After adding a predetermined amount of an organic binder and a solvent to the material powder mixture, thereby to prepare a blended granulated powder. Then, the granulated powder was press-molded at a molding pressure of 130 MPa, thereby to prepare a number of molded compacts. Thereafter, thus prepared molded compacts were degreased in air-flowing atmosphere at temperature of 450° C. for 4 hours.

Thereafter, the compacts were further heated in vacuum atmosphere of $10^{-2}$ Pa or lower to a temperature of 1400° C. and held at this state for two hours thereby to conduct a holding operation. Thereafter, the degreased molded compacts were sintered and further densified by holding the compacts in a nitrogen gas ($N_2$) atmosphere under a pressure of 0.7 MPa at a temperature of 1825° C. for 6 hours.

Thereafter, the sintered bodies were moderately cooled at different cooling rates of: 100° C./hr (Examples 1); 50° C./hr (Example 2); and 25° C./hr (Example 3); until the temperature in a sintering furnace was reduced down to 1500° C., by controlling an amount of power supplied to a heating unit associated with the sintering furnace, thereby to prepare a number of silicon nitride ceramic substrates for the respective Examples 1–3 each having a unified size of 50 mm-long×40 mm-wide×0.9 mm-thickness.

In addition, as Example 4, the manufacturing steps were repeated under the same conditions as in Example 1 except that the holding operation on the way to sintering step was performed in such a manner that the molded compact was held in nitrogen gas atmosphere of $1\times10^4$ Pa at a temperature of 1600° C. for 2 hours, thereby to prepare a silicon nitride ceramic substrate of Example 4.

COMPARATIVE EXAMPLES 1–3

As comparative Example 1, the manufacturing steps were repeated under the same conditions as in Example 1 except that the molding pressure was set to 90 MPa and the holding operation in vacuum at temperature of 1400° C. was not performed, thereby to prepare silicon nitride ceramic substrate of Comparative Example 1.

As comparative Example 2, the manufacturing steps were repeated under the same conditions as in Example 1 except that the molding pressure was set to 90 MPa, the holding operation in vacuum at temperature of 1400° C. was not performed and the cooling rates after the sintering operation were set to 500° C./hr which is conventional natural cooling rate, thereby to prepare silicon nitride ceramic substrate of Comparative Example 2.

As comparative Example 3, manufacturing steps were repeated under the same conditions as in Example 1 except that the $Si_3N_4$ (silicon nitride) material powder containing 1.7 wt % of oxygen, total 0.7 wt % of impurity cationic elements and 91 wt % of α-phase silicon nitride, and having an average grain size of 1.5 μm was used, thereby to prepare silicon nitride ceramic substrate of Comparative Example 3.

With respect to thus prepared silicon nitride ceramic substrates of Examples 1–4 and Comparative Examples 1–3, total oxygen content, porosity, maximum pore size in the grain boundary, leak current value, thermal conductivity, three-point bending strength at room temperature and fracture toughness were measured. The fracture toughness was measured by Niihara system based on a micro-indentation method. The measured results are shown in table 1.

In this connection, the measuring of the leak current was performed as following manner. Namely, both surfaces of the respective plate-shaped ceramic substrates were subjected to grinding work using a diamond grindstone so as to provide a thickness of 0.6 mm. Then, each of the substrates was installed in a chamber of which inner atmospheric conditions were controlled to have a temperature of 25° C. and a relative humidity of 70%. Thereafter, when an alternative voltage of 1.5 kV (100 Hz) was applied to a portion between front and rear surfaces of the plate-shaped, a value of the leak current flowing the portion of the substrate was measured by means of a curve-tracer measuring device.

In addition, the porosity of the substrate was measured by Archimedes' method, while the thermal conductivity was measured by a laser-flash method. The maximum pore size in the grain boundary phase was measured as follows. Namely, three regions each having a unit area of 100 μm-long×100 μm-wide are arbitrarily set on a cross section of the sintered body constituting the substrate, then an enlarged photographic image was taken with respect to the regions by means of a scanning-type electron microscope (SEM). Among the pores shown in the image, a pore having the largest diameter was selected. As the maximum pore size, a length of a diagonal line having the longest length in the pores shown in the enlarged images was adopted.

Further, the total oxygen content in the silicon nitride ceramic substrate was measured by means of an oxygen analyzer based on an inert gas fusion-infrared absorption method.

Furthermore, the three-point bending strength was measured as follows. That is, one surface of the sintered body was subjected to the grind work using a diamond grindstone to set the thickness to 0.6 mm. Then, the sintered body was positioned so that as-sintered surface of the sintered body became a tensile surface at the three-point bending strength test, and the sintered body was supported at a supporting span of 30 mm, while a load-applying speed was set to 0.5 mm/min. Under these conditions, the three-point bending strength was measured. The measuring results are shown in Table 1 hereunder.

powder, $Y_2O_3$ powder, MgO powder, $HfO_2$ (hafnium oxide) powder used in Example 1, various rare earth elements oxide powders having average grain sizes of 0.9–1.0 μm and various compound powders having average grain sizes of 0.4–0.5 μm as listed in Tables 2 and 3, so as to provide

TABLE 1

| Sample | Holding Condition on the way to Sintering Operation Temp. × Time × (Pres.) (° C.) × (hr) × (Pa) | Sintering Condition Temp. × Time × Pres. (° C.) × (hr) × (MPa) | Cooling Rate till 1500° C. after Sintering (° C./hr) | Total Oxygen Content (wt %) |
|---|---|---|---|---|
| Example 1 | Vacuum 1400 × 2 × ($\leq 10^{-2}$) | 1825 × 6 × 0.7 | 100 | 3.4 |
| Example 2 | Vacuum 1400 × 2 × ($\leq 10^{-2}$) | 1825 × 6 × 0.7 | 50 | 3.2 |
| Example 3 | Vacuum 1400 × 2 × ($\leq 10^{-2}$) | 1825 × 6 × 0.7 | 25 | 2.9 |
| Example 4 | $N_2$ gas 1600 × 2 × (1 × $10^4$) | 1825 × 6 × 0.7 | 100 | 3.4 |
| C. Example 1 | None | 1825 × 6 × 0.7 | 100 | 4.0 |
| C. Example 2 | None | 1825 × 6 × 0.7 | 500 | 4.0 |
| C. Example 3 | Vacuum 1400 × 2 × ($\leq 10^{-2}$) | 1825 × 6 × 0.7 | 100 | 4.2 |

| Sample | Porosity (%) | Maximum Pore Size in Grain Boundary Phase (μm) | Leak Current (nA) | Thermal Conductivity (W/m · K) | Three-Point Bending Strength (MPa) | Fracture Toughness (MPa · m½) |
|---|---|---|---|---|---|---|
| Example 1 | 0.06 | 0.08 | 50 | 80 | 750 | 6.9 |
| Example 2 | 0.05 | 0.05 | 30 | 84 | 720 | 7.2 |
| Example 3 | 0.02 | 0.03 | 20 | 90 | 680 | 7.5 |
| Example 4 | 0.02 | 0.1 | 100 | 75 | 740 | 6.8 |
| C. Example 1 | 0.13 | 0.5 | 1500 | 70 | 700 | 6.6 |
| C. Example 2 | 0.15 | 0.6 | 1800 | 40 | 760 | 6.7 |
| C. Example 3 | 2.8 | 0.9 | 2500 | 45 | 580 | 6.4 |

Note:
C. Example denotes Comparative Example.

As is clear from the results shown in Table 1, in the respective silicon nitride ceramic substrates of Examples, each of the ceramic substrate was manufactured in such a manner that the molded compact was subjected to a predetermined holding treatment on the way to the sintering step, thereafter sintered, so that the oxygen content in the ceramic substrate was reduced and the generation of the pore was suppressed thereby to enable the maximum pore size to be extremely small. Therefore, there could be obtained the silicon nitride ceramic substrate causing less leak-current, and having a high thermal conductivity and a high strength.

On the other hand, in Comparative Examples 1 and 2 in which the holding treatment was not performed on the way to the sintering step, the effect of reducing the oxygen content was small, so that pores remained in the sintered body thereby to disadvantageously increase the leak current value.

Further, when setting the cooling rate to high and the sintered body was rapidly cooled as in Comparative Example 2, the ratio of the crystal phase in the grain boundary was lowered and the maximum pore size was increased thereby to lower the thermal conductivity. In addition, the ratio of the glass phase in the grain boundary phase became relatively large, so that the leak current value was also increased.

Furthermore, in case of Comparative Example 2 where the oxygen content in the material powder was excessively large, even if the holding treatment on the way to the sintering step and the moderately cooling treatment were performed, it was confirmed that the porosity was large, and also the maximum pore size became large, so that the leak current value was increased, thus lowering the insulating property of the substrate.

EXAMPLES 5–47

Material mixtures for Examples 5–47 for Examples 5–47 were prepared by blending $Si_3N_4$ (silicon nitride) material compositions indicated in Tables 2 and 3, thereby to prepare the material powder mixtures for the respective Examples.

Then, each of thus obtained material powder mixtures was molded and degreased under the same conditions, thereafter, the degreased compact was subjected to a holding treatment under the conditions shown in Tables 2 and 3 on the way to a sintering step, followed by sintering the compact, thereby to prepare the respective silicon nitride ceramic substrates of Examples 5–47.

In addition, as Examples of 43–45, the ceramic substrates prepared in Examples 29–31 were further subjected to a grinding work under the conditions indicated in Example 1 so as to control the thickness of each substrates to be 0.3 mm, thereby to prepare the respective silicon nitride ceramic substrates of Examples 43–45.

COMPARATIVE EXAMPLES 4–9

The material mixtures of Comparative Examples 4–9 were respectively prepared as indicated in Table 3. More specifically, an excessively small amount of $Y_2O_3$ was added (Comparative Example 4), an excessive amount of $Er_2O_3$ was added (Comparative Example 5), an excessive amount of $Ho_2O_3$ was added (Comparative Example 6), an excessive amount of MgO was added (Comparative Example 7), an excessive amount of $HfO_2$ was added (Comparative Example 8) and an excessive amount of $TiO_2$ was added (Comparative Example 9).

The material mixtures were then molded and degreased to form degreased compacts under substantially the same conditions as in Example 5. Thereafter, the degreased compacts were subjected to the holding operation on the way to a sintering step, followed by conducting the sintering operation under conditions shown in Table 3, thus obtaining the silicon nitride ceramic substrates of Comparative Examples 4–9.

With respect to thus prepared silicon nitride ceramic substrates of Examples and Comparative Examples, total oxygen content, porosity, maximum pore size in the grain boundary, leak current value, thermal conductivity, three-point bending strength at room temperature and fracture toughness were measured under the same conditions as in Example 1. The measured results are shown in Tables 2 and 3 hereunder.

TABLE 2

| Sample | | $Si_3N_4$ | Rare Earth Oxide | MgO | $HfO_2$ | Other Component | Holding Condition on the way to Sintering Operation Temp. × Time × (Pressure) (° C.) × (hr) × (Pa) | Sintering Condition Temp. × Time × Pres. (° C.) × (hr) × (MPa) |
|---|---|---|---|---|---|---|---|---|
| Example | 5 | 95 | $Y_2O_3$ | 2 | 3 | | Vacuum 1300 × 2 × ($\leq 10^{-2}$) | 1850 × 8 × 0.7 |
| | 6 | 95 | $Y_2O_3$ | 5 | | | $N_2$ gas 1600 × 2 × (1 × $10^4$) | 1900 × 8 × 0.7 |
| | 7 | 93 | $Y_2O_3$ | 5 | 2 | | Vacuum 1400 × 1 × ($\leq 10^{-2}$) | 1750 × 6 × 0.7 |
| | 8 | 92 | $Y_2O_3$ | 5 | | 3 | $N_2$ gas 1600 × 2 × (1 × $10^4$) | 1800 × 8 × 0.7 |
| | 9 | 92.5 | $Y_2O_3$ | 5 | 0.5 | 2 | $N_2$ gas 1600 × 2 × (1 × $10^4$) | 1750 × 6 × 0.7 |
| | 10 | 89 | $Y_2O_3$ | 5 | 3 | 3 | Vacuum 1400 × 1 × ($\leq 10^{-2}$) | 1700 × 8 × 0.01 |
| | 11 | 89 | $Y_2O_3$ | 5 | 3 | 3 | $N_2$ gas 1600 × 2 × (1 × $10^4$) | 1700 × 8 × 0.01 |
| | 12 | 90 | $Y_2O_3$ | 7.5 | 0.5 | 2 | $N_2$ gas 1600 × 2 × (1 × $10^4$) | 1850 × 8 × 0.7 |
| | 13 | 91 | $Y_2O_3$ | 7.5 | 1 | 0.5 | $N_2$ gas 1600 × 2 × (1 × $10^4$) | 1850 × 8 × 0.7 |
| | 14 | 92.5 | $Er_2O_3$ | 7.5 | | | $N_2$ gas 1600 × 2 × (1 × $10^4$) | 1900 × 8 × 0.7 |
| | 15 | 85.5 | $Er_2O_3$ | 12.5 | | 2 | $N_2$ gas 1600 × 2 × (1 × $10^4$) | 1900 × 8 × 0.7 |
| | 16 | 82.5 | $Er_2O_3$ | 15 | 0.5 | 2 | $N_2$ gas 1600 × 2 × (1 × $10^4$) | 1850 × 8 × 0.7 |
| | 17 | 81 | $Er_2O_3$ | 15 | 2 | 2 | Vacuum 1400 × 1 × ($\leq 10^{-2}$) | 1800 × 8 × 0.7 |
| | 18 | 88 | $Ho_2O_3$ | 10 | | 2 | $N_2$ gas 1600 × 2 × (1 × $10^4$) | 1900 × 8 × 0.7 |
| | 19 | 82.5 | $Ho_2O_3$ | 15 | 0.5 | 2 | $N_2$ gas 1600 × 2 × (1 × $10^4$) | 1850 × 8 × 0.7 |
| | 20 | 81 | $Ho_2O_3$ | 15 | 2 | 2 | Vacuum 1400 × 1 × ($\leq 10^{-2}$) | 1800 × 8 × 0.7 |
| | 21 | 82.5 | $Dy_2O_3$ | 15 | 0.5 | 2 | $N_2$ gas 1600 × 2 × (1 × $10^4$) | 1850 × 8 × 0.7 |
| | 22 | 82.5 | $Yb_2O_3$ | 15 | 0.5 | 2 | $N_2$ gas 1600 × 2 × (1 × $10^4$) | 1850 × 8 × 0.7 |
| | 23 | 85 | $Sm_2O_3$ | 12.5 | 0.5 | 2 | $N_2$ gas 1600 × 2 × (1 × $10^4$) | 1850 × 8 × 0.7 |
| | 24 | 82.5 | $Nd_2O_3$ | 15 | 0.5 | 2 | $N_2$ gas 1600 × 2 × (1 × $10^4$) | 1850 × 8 × 0.7 |
| | 25 | 82.5 | $Pr_6O_{11}$ | 15 | 0.5 | 2 | $N_2$ gas 1600 × 2 × (1 × $10^4$) | 1850 × 8 × 0.7 |
| | 26 | 84.5 | $CeO_2$ | 12.5 | 1 | 2 | $N_2$ gas 1600 × 2 × (1 × $10^4$) | 1850 × 8 × 0.7 |
| | 27 | 87 | $Gd_2O_3$ | 10 | 1 | 2 | $N_2$ gas 1600 × 2 × (1 × $10^4$) | 1850 × 8 × 0.7 |
| | 28 | 90 | $Y_2O_3$ $Er_2O_3$ | 3.5 6.5 | | | $N_2$ gas 1600 × 1 × (1 × $10^4$) | 1900 × 8 × 0.7 |
| | 29 | 88 | $Y_2O_3$ $Er_2O_3$ | 3.5 6.5 | | 2 | $N_2$ gas 1600 × 1 × (1 × $10^4$) | 1850 × 8 × 0.7 |
| | 30 | 87.5 | $Y_2O_3$ $Er_2O_3$ | 3.5 6.5 | 0.5 | 2 | $N_2$ gas 1600 × 1 × (1 × $10^4$) | 1850 × 8 × 0.7 |
| | 31 | 86 | $Y_2O_3$ $Er_2O_3$ | 3.5 6.5 | 2 | 2 | Vacuum 1400 × 1 × ($\leq 10^{-2}$) | 1850 × 8 × 0.7 |
| | 32 | 87.5 | $Y_2O_3$ $Ho_2O_3$ | 3.5 6.5 | 0.5 | 2 | $N_2$ gas 1600 × 1 × (1 × $10^4$) | 1850 × 8 × 0.7 |
| | 33 | 86 | $Y_2O_3$ $Ho_2O_3$ | 3.5 6.5 | 2 | 2 | Vacuum 1400 × 1 × ($\leq 10^{-2}$) | 1850 × 8 × 0.7 |

| Sample | | Cooling Rate till 1500° C. after Sintering (° C./hr) | Total Oxygen Content (wt %) | Porosity (%) | Maximum Pore Size in Grain Boundary Phase (μm) | Leak Current (nA) | Thermal Conductivity (W/m · K.) | Three-Point Bending Strength (MPa) | Fracture Toughness (MPa · m½) |
|---|---|---|---|---|---|---|---|---|---|
| Example | 5 | 100 | 2.3 | 1 | 0.1 | 100 | 75 | 690 | 6.6 |
| | 6 | 100 | 1.7 | 0.2 | 0.1 | 80 | 95 | 665 | 6.7 |
| | 7 | 50 | 2.4 | 0.05 | 0.05 | 30 | 84 | 800 | 6.8 |
| | 8 | 50 | 2.1 | 0.1 | 0.03 | 20 | 90 | 680 | 6.8 |
| | 9 | 100 | 2.1 | 0.05 | 0.02 | 20 | 86 | 750 | 6.9 |
| | 10 | 100 | 3.2 | 0.03 | 0.1 | 150 | 74 | 850 | 6.8 |
| | 11 | 25 | 3.3 | 0.02 | 0.1 | 150 | 73 | 840 | 6.7 |
| | 12 | 100 | 2.8 | 0.1 | 0.08 | 100 | 115 | 700 | 7.0 |
| | 13 | 100 | 2.7 | 0.06 | 0.06 | 70 | 105 | 780 | 7.1 |
| | 14 | 50 | 2.8 | 0.8 | 0.05 | 60 | 111 | 670 | 6.6 |
| | 15 | 50 | 2.5 | 1 | 0.06 | 100 | 125 | 620 | 7.0 |
| | 16 | 50 | 3 | 0.1 | 0.06 | 70 | 120 | 655 | 7.2 |
| | 17 | 25 | 3.3 | 0.06 | 0.15 | 290 | 98 | 730 | 7.0 |
| | 18 | 50 | 2.3 | 0.2 | 0.04 | 40 | 118 | 640 | 6.9 |
| | 19 | 50 | 3.1 | 0.1 | 0.05 | 80 | 120 | 685 | 7.0 |
| | 20 | 25 | 3.2 | 0.04 | 0.08 | 200 | 100 | 700 | 6.9 |
| | 21 | 50 | 3 | 0.1 | 0.06 | 180 | 116 | 685 | 6.7 |
| | 22 | 50 | 2.9 | 0.07 | 0.06 | 100 | 130 | 600 | 6.7 |
| | 23 | 50 | 2.8 | 0.1 | 0.05 | 60 | 115 | 690 | 6.7 |
| | 24 | 50 | 3.1 | 0.1 | 0.05 | 100 | 114 | 675 | 6.8 |
| | 25 | 50 | 3 | 0.1 | 0.05 | 90 | 110 | 680 | 6.7 |
| | 26 | 50 | 2.9 | 0.05 | 0.04 | 70 | 111 | 675 | 6.8 |
| | 27 | 50 | 2.7 | 0.07 | 0.03 | 60 | 116 | 650 | 6.7 |
| | 28 | 50 | 2.3 | 0.2 | 0.03 | 20 | 120 | 650 | 7.0 |
| | 29 | 50 | 2.6 | 1 | 0.04 | 50 | 125 | 660 | 7.0 |
| | 30 | 50 | 2.7 | 0.5 | 0.04 | 60 | 120 | 700 | 7.2 |

TABLE 2-continued

| | | | | | | | | |
|---|---|---|---|---|---|---|---|---|
| 31 | 50 | 2.8 | 0.05 | 0.05 | 70 | 98 | 800 | 7.1 |
| 32 | 50 | 2.7 | 0.7 | 0.04 | 50 | 123 | 685 | 7.0 |
| 33 | 50 | 2.8 | 0.05 | 0.06 | 80 | 100 | 770 | 7.0 |

TABLE 3

| Sample | | Material Composition (wt %) | | | | | | Holding Condition on the way to Sintering Operation Temp. × Time × (Pres.) (° C.) × (hr) × (Pa) | Sintering Condition Temp. × Time × Pres. (° C.) × (hr) × (MPa) |
|---|---|---|---|---|---|---|---|---|---|
| | | $Si_3N_4$ | Rare Earth Oxide | | MgO | $HfO_2$ | Other Component | | |
| Example | 34 | 89.5 | $Y_2O_3$ | 7.5 | 0.5 | 2 | $TiO_2$ | 1 | Vacuum 1300 × 1 × ($\leq 10^{-2}$) | 1850 × 8 × 0.7 |
| | 35 | 88 | $Y_2O_3$ | 7.5 | 0.5 | 2 | $TiO_2$ | 2 | Vacuum 1300 × 1 × ($\leq 10^2$) | 1850 × 8 × 0.7 |
| | 36 | 89.5 | $Y_2O_3$ | 7.5 | 0.5 | 2 | $ZrO_2$ | 1 | Vacuum 1300 × 1 × ($\leq 10^2$) | 1850 × 8 × 0.7 |
| | 37 | 89.5 | $Y_2O_3$ | 7.5 | 0.5 | 2 | WC | 1 | Vacuum 1300 × 1 × ($\leq 10^{-2}$) | 1850 × 8 × 0.7 |
| | 38 | 89.5 | $Y_2O_3$ | 7.5 | 0.5 | 2 | $Mo_2C$ | 1 | Vacuum 1300 × 1 × ($\leq 10^{-2}$) | 1850 × 8 × 0.7 |
| | 39 | 89.5 | $Y_2O_3$ | 7.5 | 0.5 | 2 | $Ta_2O_5$ | 1 | Vacuum 1300 × 1 × ($\leq 10^{-2}$) | 1850 × 8 × 0.7 |
| | 40 | 89.5 | $Y_2O_3$ | 7.5 | 0.5 | 2 | $Nb_2O_3$ | 1 | Vacuum 1300 × 1 × ($\leq 10^{-2}$) | 1850 × 8 × 0.7 |
| | 41 | 89.5 | $Y_2O_3$ | 7.5 | 0.5 | 2 | $V_2O_5$ | 1 | Vacuum 1300 × 1 × ($\leq 10^{-2}$) | 1850 × 8 × 0.7 |
| | 42 | 89.5 | $Y_2O_3$ | 7.5 | 0.5 | 2 | $Cr_2O_3$ | 1 | Vacuum 1300 × 1 × ($\leq 10^{-2}$) | 1850 × 8 × 0.7 |
| | 43 | 88 | $Y_2O_3$ $Er_2O_3$ | 3.5 6.5 | | 2 | | | $N_2$ gas 1600 × 1 × (1 × $10^4$) | 1850 × 8 × 0.7 |
| | 44 | 87.5 | $Y_2O_3$ $Er_2O_3$ | 3.5 6.5 | 0.5 | 2 | | | $N_2$ gas 1600 × 1 × (1 × $10^4$) | 1850 × 8 × 0.7 |
| | 45 | 86 | $Y_2O_3$ $Er_2O_3$ | 3.5 6.5 | 2 | 2 | | | Vacuum 1400 × 1 × ($\leq 10^{-2}$) | 1850 × 8 × 0.7 |
| | 46 | 89 | $Y_2O_3$ | 5 | 3 | 3 | | | Vacuum 1300 × 1 × ($\leq 10^{-2}$) | 1700 × 6 × 0.01 |
| | 47 | 89 | $Y_2O_3$ | 5 | 3 | 3 | | | $N_2$ gas 1500 × 2 × (1 × $10^4$) | 1700 × 6 × 0.01 |
| C. Example | 4 | 96 | $Y_2O_3$ | 1 | 3 | 2 | | | $N_2$ gas 1600 × 2 × (1 × $10^4$) | 1850 × 8 × 0.7 |
| | 5 | 77 | $Er_2O_3$ | 20 | 1 | 2 | | | Vacuum 1400 × 1 × ($\leq 10^{-2}$) | 1850 × 8 × 0.7 |
| | 6 | 78 | $Ho_2O_3$ | 20 | | 2 | | | Vacuum 1400 × 1 × ($\leq 10^{-2}$) | 1850 × 8 × 0.7 |
| | 7 | 91 | $Y_2O_3$ | 5 | 4 | | | | Vacuum 1400 × 1 × ($\leq 10^{-2}$) | 1700 × 8 × 0.7 |
| | 8 | 89 | $Y_2O_3$ | 5 | 2 | 4 | | | $N_2$ gas 1600 × 2 × (1 × $10^4$) | 1750 × 8 × 0.7 |
| | 9 | 88 | $Y_2O_3$ | 5 | 2 | 2 | $TiO_2$ | 3 | Vacuum 1400 × 1 × ($\leq 10^{-2}$) | 1750 × 8 × 0.7 |

| Sample | | Cooling Rate till 1500° C. after Sintering (° C./hr) | Total Oxygen Content (wt %) | Porosity (%) | Maximum Pore Size in Grain Boundary Phase (μm) | Leak Current (nA) | Thermal Conductivity (W/m · K.) | Three-Point Bending Strength (MPa) | Fracture Toughness (MPa · m½) |
|---|---|---|---|---|---|---|---|---|---|
| Example | 34 | 100 | 2.7 | 0.08 | 0.07 | 80 | 110 | 705 | 7.0 |
| | 35 | 50 | 3.2 | 0.05 | 0.07 | 150 | 88 | 720 | 7.2 |
| | 36 | 50 | 2.6 | 0.1 | 0.06 | 50 | 100 | 710 | 7.0 |
| | 37 | 50 | 2.4 | 0.1 | 0.06 | 60 | 100 | 680 | 6.9 |
| | 38 | 50 | 2.5 | 0.1 | 0.06 | 60 | 112 | 670 | 6.9 |
| | 39 | 50 | 2.5 | 0.1 | 0.05 | 50 | 105 | 700 | 6.8 |
| | 40 | 50 | 2.5 | 0.1 | 0.06 | 60 | 110 | 680 | 6.9 |
| | 41 | 50 | 2.5 | 0.1 | 0.06 | 50 | 107 | 665 | 6.6 |
| | 42 | 50 | 2.4 | 0.1 | 0.06 | 55 | 105 | 720 | 6.7 |
| | 43 | 10 | 2.6 | 1 | 0.04 | 55 | 125 | 650 | 7.0 |
| | 44 | 20 | 2.7 | 0.5 | 0.04 | 60 | 120 | 670 | 7.2 |
| | 45 | 50 | 2.8 | 0.05 | 0.05 | 75 | 98 | 760 | 7.1 |
| | 46 | 500 (Natural Cooling) | 3.3 | 0.04 | 0.2 | 400 | 55 | 840 | 6.9 |
| | 47 | 500 (Natural Cooling) | 3.5 | 0.05 | 0.25 | 700 | 50 | 850 | 6.7 |
| C. Example | 4 | 50 | 2.4 | 2.8 | 0.15 | 200 | 65 | 540 | 6.5 |
| | 5 | 50 | 3.8 | 2.6 | 0.2 | 250 | 78 | 530 | 6.2 |
| | 6 | 50 | 3.5 | 5.5 | 0.3 | 400 | 75 | 480 | 6.0 |
| | 7 | 50 | 3.3 | 0.1 | 0.1 | 200 | 60 | 780 | 6.7 |
| | 8 | 50 | 3.1 | 0.1 | 0.08 | 100 | 59 | 700 | 6.7 |
| | 9 | 50 | 3.8 | 0.1 | 0.25 | 350 | 60 | 750 | 6.8 |

Note:
C. Example denotes Comparative Example.

As is clear from the results shown in Tables 2 and 3, in the respective silicon nitride ceramic substrates of Examples each of which was manufactured in such a manner that the material powder mixture containing specified rare earth element and oxygen was molded to form the compact, then the compact was subjected to the holding treatment under the predetermined conditions on the way to the sintering step, followed by sintering and moderately cooling the sintered body, so that the oxygen content in the ceramic substrate was reduced and the generation of the pore was suppressed thereby to enable the maximum pore size to be extremely small. Therefore, there could be obtained the silicon nitride ceramic substrate causing less leak-current, and having a high thermal conductivity and a high strength.

On the other hand, in the ceramic substrates as shown in Comparative Examples 4–9 in which the amount of rare earth elements were set to outside the range specified in the present invention, even if the holding treatment on the way to the sintering step and the moderately cooling operation after the sintering operation were performed, it was confirmed that the substrate of Comparative Examples cannot satisfy at least one of the required characteristics such as total oxygen content, porosity, maximum pore size, thermal conductivity, three-point bending strength or the like that are specified in the present invention.

In also the silicon nitride ceramic substrate of Examples 46 and 47 each having the same composition as in Example 10 and manufactured by setting the cooling rate after the sintering operation to 500° C./hr (natural cooling rate), there could be obtained the leak current values within the range specified in the present invention. However, it was confirmed that the ceramic substrates of Examples 46 and 47 were somewhat inferior in thermal conductivity to the substrate of Example 10 manufactured through the moderately cooling operation.

Further, with respect to the silicon nitride ceramic substrates of Example 28 and Comparative Example 2, the leak current value was measured in a case where the voltage applied to the substrate was changed. Thus obtaining the results shown in table 4 hereunder.

TABLE 4

| | Leak Current Value (nA) | | | |
|---|---|---|---|---|
| Applied Voltage | 0.02 kV | 0.1 kV | 1.5 kV | 4 kV |
| Example | 1 | 15 | 120 | 330 |
| C. Example | 10 | 100 | 1800 | 4750 |

Note:
C. Example denotes Comparative Example.

As is clear from the results shown in Table 4, in a case where the applied voltage was 0.1 kV or less, there was no prominent difference in the leak current values in the respective silicon nitride ceramic substrates. However, as the applied voltage was increased, it was confirmed there arose a tendency of the difference was expanded. In other words, the respective silicon nitride ceramic substrates of these Examples are effective for a circuit board to which a relatively higher voltage than 0.1 kV (100 V) is applied.

Figure 2:
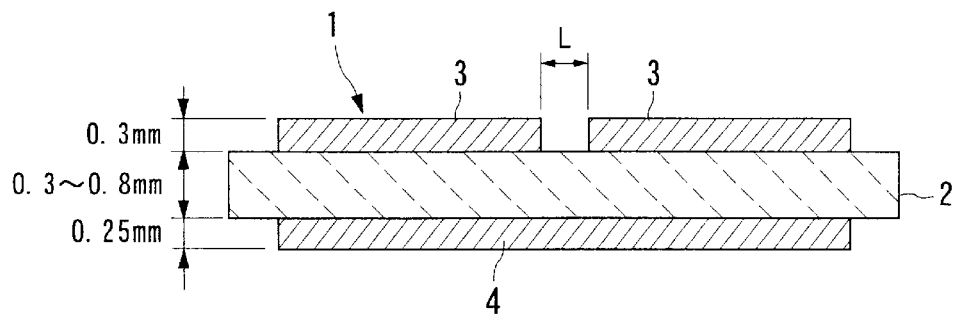
FIG. 2 is a cross-sectional view of the silicon nitride ceramic circuit board shown in FIG. 1.
Figure 3:
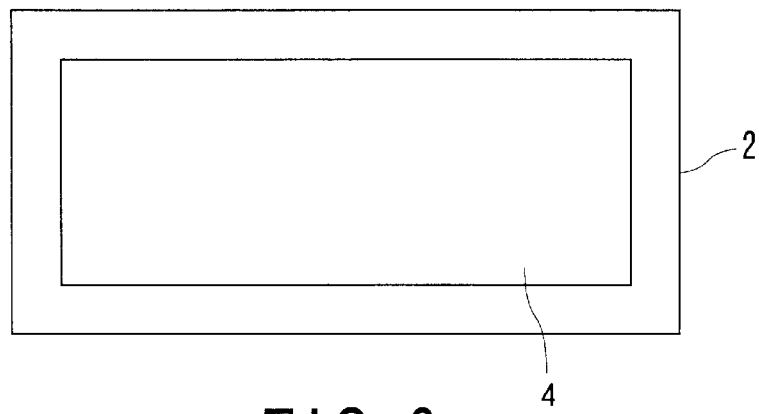
FIG. 3 is a bottom view of the silicon nitride ceramic circuit board shown in FIG. 1.

In addition, by using the silicon nitride ceramic substrates of the above Example 28 and Comparative Example 2, there were manufactured the respective silicon nitride ceramic circuit boards 1 as shown in Table 5 and FIGS. 1–3. This silicon nitride ceramic circuit board 1 is manufactured in such a manner that Cu plates each having a thickness of 0.30 mm as a pair of metal circuit plates 3, 3 are bonded to a front side surface of the silicon nitride ceramic substrate 2 so that a gap L between the paired Cu plates 3, 3 is set to a value shown in Table 5, while a backing copper plate having a thickness of 0.25 mm as a backing metal plate 4 is bonded to a rear side surface of the silicon nitride ceramic substrate 2.

In this regard, as the method of bonding the metal plate, an active metal brazing method or a direct bonding copper (DBC) method was used as shown in Table 5. In the active metal brazing method, the copper plates were bonded through a brazing material having a composition of 70Ag—27Cu—3Ti (wt % basis).

On the other hand, in the direct bonding copper (DBC) method, the surface of the silicon nitride ceramic substrate was oxidized so as to form an oxidized layer having a thickness of about 1 μm. Thereafter, the copper plates were bonded to the substrate.

Further, a semiconductor element (chip) was mounted onto the silicon nitride ceramic circuit board, thereby to assemble a semiconductor module. Then, the semiconductor chips were examined whether they functions well or not by applying a voltage of 0.02 kV or 1.5 kV as an operation voltage to the respective semiconductor modules. More concretely to say, 100 sets of the above semiconductor modules were prepared for each Example and Comparative Example, and an electronic device into which the semiconductor module was assembled was continuously operated for 100 hours. When all of 100 pieces of the semiconductor chips was normally functioned, the circuit board was evaluated by a symbol ○ which means to arise no defect, while when all of 100 pieces of the semiconductor chips was not normally functioned, the circuit board was evaluated by a symbol X which means to arise at least one defect. The evaluation results are shown in Table 5 hereunder.

TABLE 5

| Circuit Board | Si$_3$N$_4$ Ceramic Substrate | Bonding Method of Circuit Plate | Gap between Circuit Plates L (mm) | Chip Function Applied Voltage | |
|---|---|---|---|---|---|
| | | | | 0.02 kV | 1.5 kV |
| Example 28-1 | Example 28 | Active Metal Brazing Method | 0.1 | ○ | ○ |
| Example 28-2 | Example 28 | Active Metal Brazing Method | 0.3 | ○ | ○ |
| Example 28-3 | Example 28 | Active Metal Brazing Method | 0.5 | ○ | ○ |
| Example 28-4 | Example 28 | Direct Bonding Copper Method | 0.1 | ○ | ○ |
| Example 28-5 | Example 28 | Active Metal Brazing Method | 2 | ○ | ○ |
| C. Example 2-1 | C. Example 2 | Active Metal Brazing Method | 0.1 | ○ | X |
| C. Example 2-2 | C. Example 2 | Active Metal Brazing Method | 0.5 | ○ | X |
| C. Example 2-3 | C. Example 2 | Direct Bonding Copper Method | 0.1 | ○ | X |
| C. Example 2-4 | C. Example 2 | Active Metal Brazing Method | 2 | ○ | Δ |

TABLE 5-continued

|  | Si$_3$N$_4$ Ceramic | Bonding Method of | Gap between Circuit Plates | Chip Function Applied Voltage | |
|---|---|---|---|---|---|
| Circuit Board | Substrate | Circuit Plate | L (mm) | 0.02 kV | 1.5 kV |

Note:
C. Example denotes Comparative Example.

As is clear from the results shown in Table 5, according to the silicon nitride ceramic circuit boards of the respective Examples, even in a case where the gap L between the paired metal circuit plates was narrowed to be 0.1 mm, the function of the respective semiconductor chips was normal, and it was confirmed the circuit boards did not arise any defect or disadvantage at all.

In contrast, in the circuit boards of the respective Comparative Examples, when the applied voltage was relatively small, all of the circuit boards normally functions well. However, when the applied voltage was increased up to 1.5 kV, there was caused defects. In particular, in a case where the gap L between the adjacent metal circuit plates was 0.5 mm or less, it was confirmed that the defects such as malfunction or the like were liable to occur.

Further, even in a case of Comparative Example 4 in which the gap L between the adjacent metal circuit plates was large to be 2 mm, the defect could not be completely eliminated, so that the circuit board of Comparative Example 4 was evaluated by a symbol Δ.

As is clear from the results shown in Tables 3 and 4, in the respective Examples, the leak current values in the ceramic substrates are controlled to be a predetermined value or less. Therefore, in a ceramic circuit board to which a relatively high voltage of 0.1 kV or more is applied, it becomes possible to set the gap L between the adjacent metal circuit plates to a narrow range of about 0.1–0.5 mm, so that a high-density mounting or a miniaturization of the circuit board can be also easily realized.

In other words, it can be said that the feature of the present invention is particularly effective for a silicon nitride circuit board having a fine circuit structure in which the gap between the adjacent metal circuit plates is in the narrow range of about 0.1–0.5 mm, and is also particularly effective for a silicon nitride circuit board to which a high operation voltage of 0.1 kV or more is applied.

Next, the present invention will be further explained more concretely with reference to Er$_2$O$_3$, the following embodiments in which the molding pressure is changed and the carbon content is controlled.

EXAMPLES 101–149

As shown in Tables 6–8, material powder mixtures for Examples 101–149 were prepared by adding rare earth oxide (at least one Y$_2$O$_3$, Er$_2$O$_3$, Ho$_2$O$_3$, Yb$_2$O$_3$, Dy$_2$O$_3$, Sm$_2$O$_3$, Nd$_2$O$_3$, Pr$_6$O$_{11}$ and CeO$_2$) powder having an average grain size of 0.7 μm, MgO (magnesium oxide) powder having an average grain size of 0.5 μm and, as required Hf (hafnium) compound powder and Ti compound or the like, as a sintering assistant agent, to Si$_3$N$_4$ (silicon nitride) material powder containing 1.3 wt % of oxygen, total 0.10 wt % of Al, Li, Na, K, Fe, Ba, Mn and B as impurity cationic elements and 97 wt % of α-phase silicon nitride, and having an average grain size of 0.40 μm, followed by wet-mixing the materials in ethyl alcohol for 72 hours, and drying the mixture, thereby to prepare material powder mixtures.

After adding a predetermined amount of an organic binder and a solvent to each of the material powder mixtures. Then, each of the material powder mixtures was uniformly mixed and press-molded or molded through Doctor-blade method at a molding pressure shown in tables 6–8, thereby to prepare a number of molded compacts. Thereafter, thus prepared molded compacts were degreased, then the degreased compacts were sintered to enhance the density thereof in a nitrogen gas atmosphere at 7.5 atm under the sintering conditions shown in tables 6–8 thereby to form sintered bodies. Immediately after the sintering operation, the sintered bodies were moderately cooled at the cooling rates shown in Tables 6–8, the cooling rates being controlled by controlling the power supplied to the heating devices provided in sintering furnaces until the temperature inside the furnaces reached 1,500° C. As a result, silicon nitride ceramic substrates of the respective Examples were thus prepared.

In this case, the size of each silicon nitride ceramic substrate was 60 mm (length)×40 mm (width)×0.3–0.5 mm (thickness). If required, the resultant ceramic substrates were subjected to a honing treatment to remove the separating powder used in the sintering operation. The thickness of the substrate is set to 0.8 mm for Examples 101–120, 0.5 mm for Examples 121–130 and 0.3 mm for Examples 131–149.

COMPARATIVE EXAMPLE 101

A silicon nitride ceramic substrate of Comparative Example 101 was prepared under substantially the same conditions as in Example 103, except that MgO was not added to the material mixture, and a special countermeasure for controlling the cooling rate was not adopted i.e. immediately after the sintering process is completed to enhance the density of the sintered body, the heating device was powered off to naturally cool the sintered body at a cooling rate (about 500° C./hr corresponding to a natural cooling rate) as performed by the conventional furnace cooling method.

COMPARATIVE EXAMPLE 102

A silicon nitride ceramic substrate of Comparative Example 102 was prepared under substantially the same conditions as in Example 103, except for using a silicon nitride material powder having an average grain size of 0.60 μm and containing 1.5% by weight of oxygen, 0.6% by weight of the impurity cationic elements and 93% by weight of alpha-phase type silicon nitride, and the molding pressure was set to a lower level of 100 MPa.

COMPARATIVE EXAMPLE 103

A silicon nitride ceramic substrate of Comparative Example 103 was prepared under substantially the same conditions as in Example 103, except that the thickness of the molded body was thick to be 1.6 mm, and the surface of the sintered body was subjected to a grinding work so as to provide the same thickness as those of other Examples.

COMPARATIVE EXAMPLE 104

A silicon nitride ceramic substrate of Comparative Example 104 was prepared under substantially the same conditions as in Example 103, except that the residual carbon content in the sintered body was set to 800 ppm which is out of the preferable range specified in the present invention.

Thus obtained silicon nitride ceramic substrates of Examples 101–149 and Comparative Examples 101–104 were examined to determine their average porosities, thermal conductivities (at 25° C.), and three-bending strengths at a room temperature. Further, X-ray diffraction analysis of each ceramic substrate was performed to determine the ratio (area ratio) of the crystal phase in the grain boundary phase.

In addition, residual carbon contents in the respective silicon nitride ceramic substrates were measured by X-ray micro analyzer (EPMA), while a circumstance of crack-formation was observed by using a microscope in the following manner. That is, four observation regions each having a square area of which one side is 10 μm were arbitrarily set on a surface of the substrate. Then, it was confirmed whether a micro crack having a width of 1 μm or more was formed or not with respect to the regions, while a maximum number of sub-micron cracks each having a width less than 1 μm formed in the region was counted through a microscope observation.

Furthermore, metal circuit plates were bonded to front and rear surfaces of the respective silicon nitride ceramic substrates. Then, a measuring electrode (tester electrode) of a curve-tracer device was contacted to the front side metal circuit plate and the rear side metal circuit plate, respectively. In this state, by applying an alternative voltage of 1.5 kV-100 Hz to a portion between the paired electrodes, the leak current was measured.

In this connection, the metal circuit plates were bonded to the substrate in accordance with an active metal brazing method in which Ag-28 wt % Cu-2 wt % Ti paste was used as the brazing material. However, as another method of bonding the metal circuit plate, it is also possible to directly bond a metal circuit plate composed of Ai-0.2~15 wt % Si alloy plate onto the substrate.

In the method of measuring the above leak current, the leak current can be also measured by directly contacting the measuring electrode to front and rear surfaces of the silicon nitride ceramic substrate. In this case, however, a contact portion of the tester electrode against the surface of the substrate is easily deviated during the measuring operation. Therefore, in this embodiment, the leak current was measure after the metal circuit plates were bonded to the substrate. In this connection, since the metal circuit plate has a good electrical conductivity, even if the leak current is measured after the metal circuit plates are bonded to the substrate, this measuring procedure has no influence on the leak current value of the substrate.

Furthermore, an alternative voltage having a high frequency of 1 MHz was applied to the portion between the paired electrodes thereby to measure a dielectric loss at the substrate by means of an impedance analyzer, thereby to obtain the results listed in Tables 6–8 hereunder.

TABLE 6

| Sample | | $Si_3N_4$ | Material Composition (wt %) Rare Earth Oxide | MgO | Other Component | | Molding Pressure (MPa) | Sintering Condition Temp. × Time × Pres. (° C.) × (hr) × (atm) | Cooling Rate till 1500° C. after Sintering (° C.) | Porosity (%) |
|---|---|---|---|---|---|---|---|---|---|---|
| Example | 101 | 95 | $Y_2O_3$ | 2 | 3 | — | — | 120 | 1800 × 8 × 5 | 25 | 1 |
| | 102 | 94.7 | $Y_2O_3$ | 5 | 0.3 | — | — | Doctor | 1900 × 8 × 9 | 50 | 0.9 |
| | 103 | 94.5 | $Y_2O_3$ | 5 | 0.5 | — | — | 120 | 1900 × 8 × 9 | 50 | 0.5 |
| | 104 | 94 | $Y_2O_3$ | 5 | 1 | — | — | 120 | 1800 × 8 × 5 | 50 | 1.2 |
| | 105 | 94 | $Y_2O_3$ | 5 | 1 | $TiO_2$ | 0.8 | 150 | 1900 × 8 × 9 | 50 | 0.2 |
| | 106 | 93 | $Y_2O_3$ | 5 | 0 | — | — | 150 | 1750 × 8 × 0.1 | 25 | 1.8 |
| | 107 | 93 | $Y_2O_3$ | 5 | 2 | — | — | 150 | 1800 × 8 × 5 | 50 | 0.3 |
| | 108 | 93 | $Y_2O_3$ | 5 | 2 | $MoO_2$ | 1 | Doctor | 1900 × 8 × 9 | 50 | 0.1 |
| | 109 | 92 | $Y_2O_3$ | 5 | 3 | — | — | 130 | 1700 × 8 × 0.1 | 25 | 0.4 |
| | 110 | 92 | $Y_2O_3$ | 5 | 3 | $TiO_2$ | 1 | 130 | 1800 × 8 × 5 | 50 | 0.1 |
| | 111 | 92 | $Y_2O_3$ | 5 | 3 | $MoO_2$ | 0.8 | 130 | 1850 × 8 × 5 | 25 | 0.1 |
| | 112 | 91.5 | $Y_2O_3$ | 7.5 | 1 | — | — | 130 | 1850 × 8 × 5 | 50 | 0.8 |
| | 113 | 91.5 | $Y_2O_3$ | 7.5 | 1 | — | — | 150 | 1900 × 8 × 9 | 100 | 0.1 |
| | 114 | 90.5 | $Y_2O_3$ | 7.5 | 2 | — | — | 180 | 1800 × 8 × 5 | 50 | 0.3 |
| | 115 | 90.5 | $Y_2O_3$ | 7.5 | 2 | $TiO_2$ | 0.6 | Doctor | 1900 × 8 × 9 | 50 | 0.1 |
| | 116 | 88 | $Y_2O_3$ | 10 | 2 | — | — | 130 | 1850 × 8 × 5 | 50 | 0.3 |
| | 117 | 91.5 | $Er_2O_3$ | 5 | 0 | — | — | 130 | 1800 × 8 × 5 | 50 | 0.1 |
| | 118 | 91.5 | $Er_2O_3$ | 7.5 | 1 | $HfO_2$ | 1.5 | 130 | 1850 × 8 × 9 | 100 | 0.1 |
| | 119 | 89 | $Er_2O_3$ | 10 | 1 | — | — | 130 | 1800 × 8 × 5 | 50 | 0.2 |
| | 120 | 89 | $Er_2O_3$ | 10 | 1 | $ZrO_2$ | 0.6 | 130 | 1900 × 8 × 9 | 50 | 0.1 |
| | 121 | 86.5 | $Er_2O_3$ | 12.5 | 1 | — | — | 130 | 1800 × 8 × 5 | 50 | 0.3 |
| | 122 | 86.5 | $Er_2O_3$ | 12.5 | 1 | $TaO_2$ | 1.2 | 160 | 1850 × 8 × 5 | 50 | 0.2 |

| Sample | | Crystal Phase Ratio to Grain Boundary Phase (Area Ratio) (%) | Thermal Conductivity (W/m · K.) | Three-Point Bending Strength (MPa) | Residual Carbon Content (ppm) | Micro-Crack | Number of Sub-micron Crack (/100 μm²) | Leak Current (nA) | Dielectric Loss 1 MHz |
|---|---|---|---|---|---|---|---|---|---|
| Example | 101 | 35 | 74 | 855 | 400 | None | 2 | 320 | ≦0.0001 |
| | 102 | 57 | 92 | 820 | 400 | None | 2 | 300 | ≦0.0001 |
| | 103 | 56 | 92 | 825 | 400 | None | 2 | 320 | ≦0.0001 |
| | 104 | 52 | 90 | 850 | 400 | None | 2 | 330 | ≦0.0001 |
| | 105 | 55 | 92 | 905 | 400 | None | 1 | 250 | ≦0.0001 |

TABLE 6-continued

| | | | | | | | | |
|---|---|---|---|---|---|---|---|---|
| 106 | 40 | 78 | 845 | 400 | None | 2 | 400 | ≦0.0001 |
| 107 | 35 | 82 | 1005 | 400 | None | 2 | 300 | ≦0.0001 |
| 108 | 45 | 87 | 905 | 400 | None | 1 | 200 | ≦0.0001 |
| 109 | 28 | 75 | 925 | 400 | None | 2 | 360 | ≦0.0001 |
| 110 | 27 | 80 | 1035 | 400 | None | 1 | 210 | ≦0.0001 |
| 111 | 30 | 82 | 1000 | 400 | None | 1 | 180 | ≦0.0001 |
| 112 | 50 | 90 | 915 | 300 | None | 1 | 250 | ≦0.0001 |
| 113 | 49 | 91 | 875 | 300 | None | 1 | 240 | ≦0.0001 |
| 114 | 37 | 82 | 955 | 300 | None | 1 | 240 | ≦0.0001 |
| 115 | 40 | 86 | 895 | 300 | None | 1 | 180 | ≦0.0001 |
| 116 | 40 | 85 | 850 | 300 | None | 1 | 260 | ≦0.0001 |
| 117 | 28 | 75 | 805 | 300 | None | 1 | 420 | ≦0.0001 |
| 118 | 37 | 82 | 925 | 300 | None | 1 | 200 | ≦0.0001 |
| 119 | 54 | 94 | 940 | 300 | None | 1 | 200 | ≦0.0001 |
| 120 | 57 | 96 | 885 | 300 | None | 1 | 130 | ≦0.0001 |
| 121 | 55 | 95 | 905 | 300 | None | 1 | 190 | ≦0.0001 |
| 122 | 57 | 96 | 915 | 300 | None | 2 | 200 | ≦0.0001 |

Note:
"Doctor" denotes a molding pressure in doctor blade method

TABLE 7

| | | Material Composition (wt %) | | | | | Molding | Sintering Condition | Cooling Rate till 1500° C. | |
|---|---|---|---|---|---|---|---|---|---|---|
| Sample | | $Si_3N_4$ | Rare Earth Oxide | | MgO | Other Component | | Pressure (MPa) | Temp. × Time × Pres. (° C.) × (hr) × (atm) | after Sintering (° C.) | Porosity (%) |
| Example | 123 | 86.5 | $Er_2O_3$ | 12.5 | 1 | — | — | 160 | 1900 × 8 × 9 | 50 | 0.1 |
| | 124 | 85.5 | $Er_2O_3$ | 12.5 | 2 | — | — | 160 | 1750 × 8 × 0.1 | 25 | 0.5 |
| | 125 | 85.5 | $Er_2O_3$ | 12.5 | 2 | — | — | Doctor | 1800 × 8 × 5 | 50 | 0.2 |
| | 126 | 85.5 | $Er_2O_3$ | 12.5 | 2 | — | — | 120 | 1850 × 8 × 5 | 50 | 0.1 |
| | 127 | 85.5 | $Er_2O_3$ | 12.5 | 2 | $HfO_2$ | 1.5 | 120 | 1900 × 8 × 9 | 50 | 0.1 |
| | 128 | 83 | $Er_2O_3$ | 15 | 2 | — | — | 150 | 1850 × 8 × 5 | 50 | 1.0 |
| | 129 | 83 | $Er_2O_3$ | 15 | 2 | — | — | 150 | 1900 × 8 × 9 | 50 | 0.4 |
| | 130 | 80.5 | $Er_2O_3$ | 17.5 | 2 | $HfO_2$ | 1 | Doctor | 1900 × 8 × 9 | 50 | 2.0 |
| | 131 | 89 | $Ho_2O_3$ | 10 | 1 | — | — | 150 | 1800 × 8 × 5 | 50 | 0.2 |
| | 132 | 89 | $Ho_2O_3$ | 10 | 1 | $TiO_2$ | 0.4 | 150 | 1900 × 8 × 9 | 50 | 0.1 |
| | 133 | 83 | $Ho_2O_3$ | 15 | 2 | — | — | 150 | 1850 × 8 × 5 | 50 | 1.2 |
| | 134 | 83 | $Ho_2O_3$ | 15 | 2 | — | — | Doctor | 1900 × 8 × 5 | 50 | 0.5 |
| | 135 | 89 | $Yb_2O_3$ | 10 | 1 | — | — | 130 | 1800 × 8 × 5 | 50 | 0.3 |
| | 136 | 89 | $Yb_2O_3$ | 10 | 1 | $MoO_2$ | 0.3 | 130 | 1850 × 8 × 5 | 50 | 0.1 |
| | 137 | 83 | $Yb_2O_3$ | 15 | 2 | — | — | 130 | 1850 × 8 × 5 | 50 | 1.3 |
| | 138 | 83 | $Yb_2O_3$ | 15 | 2 | — | — | 130 | 1900 × 8 × 9 | 50 | 0.5 |
| | 139 | 89 | $Dy_2O_3$ | 10 | 1 | — | — | 130 | 1800 × 8 × 5 | 50 | 0.2 |
| | 140 | 86.5 | $Dy_2O_3$ | 12.5 | 1 | — | — | Doctor | 1850 × 8 × 5 | 50 | 0.3 |
| | 141 | 86.5 | $Dy_2O_3$ | 12.5 | 1 | — | — | 130 | 1900 × 8 × 9 | 50 | 0.1 |
| | 142 | 85.5 | $Sm_2O_3$ | 12.5 | 2 | — | — | 200 | 1850 × 8 × 5 | 50 | 0.3 |
| | 143 | 86.5 | $Nd_2O_3$ | 12.5 | 1 | $WO_2$ | 1 | 130 | 1850 × 8 × 5 | 50 | 0.3 |
| | 144 | 86.5 | $Pr_6O_{11}$ | 12.5 | 1 | — | — | 130 | 1850 × 8 × 5 | 50 | 0.2 |

| Sample | | Crystal Phase Ratio to Grain Boundary Phase (Area Ratio) (%) | Thermal Conductivity (W/m · K) | Three-Point Bending Strength (MPa) | Residual Carbon Content (ppm) | Micro-Crack | Number of Sub-micron Crack (/100 μm²) | Leak Current (nA) | Dielectric Loss 1 MHz |
|---|---|---|---|---|---|---|---|---|---|
| Example | 123 | 60 | 100 | 840 | 300 | None | 1 | 200 | ≦0.0001 |
| | 124 | 41 | 86 | 905 | 300 | None | 1 | 230 | ≦0.0001 |
| | 125 | 43 | 90 | 985 | 300 | None | 1 | 230 | ≦0.0001 |
| | 126 | 45 | 92 | 925 | 300 | None | 1 | 200 | ≦0.0001 |
| | 127 | 53 | 96 | 850 | 300 | None | 0 | 150 | ≦0.0001 |
| | 128 | 55 | 92 | 850 | 350 | None | 1 | 250 | ≦0.0001 |
| | 129 | 57 | 95 | 805 | 350 | None | 1 | 220 | ≦0.0001 |
| | 130 | 54 | 92 | 765 | 350 | None | 0 | 160 | ≦0.0001 |
| | 131 | 55 | 93 | 955 | 350 | None | 2 | 180 | ≦0.0001 |
| | 132 | 57 | 95 | 905 | 350 | None | 1 | 150 | ≦0.0001 |
| | 133 | 53 | 92 | 855 | 350 | None | 2 | 180 | ≦0.0001 |
| | 134 | 60 | 96 | 885 | 350 | None | 1 | 180 | ≦0.0001 |
| | 135 | 58 | 93 | 920 | 350 | None | 1 | 160 | ≦0.0001 |
| | 136 | 61 | 96 | 955 | 350 | None | 2 | 190 | ≦0.0001 |
| | 137 | 53 | 90 | 825 | 350 | None | 2 | 220 | ≦0.0001 |
| | 138 | 55 | 93 | 785 | 350 | None | 1 | 210 | ≦0.0001 |
| | 139 | 53 | 91 | 975 | 280 | None | 1 | 190 | ≦0.0001 |
| | 140 | 55 | 93 | 965 | 280 | None | 1 | 190 | ≦0.0001 |
| | 141 | 56 | 95 | 895 | 280 | None | 1 | 180 | ≦0.0001 |

TABLE 7-continued

| | | | | | | | | |
|---|---|---|---|---|---|---|---|---|
| 142 | 54 | 93 | 905 | 280 | None | 1 | 190 | ≦0.0001 |
| 143 | 57 | 92 | 920 | 280 | None | 1 | 130 | ≦0.0001 |
| 144 | 55 | 93 | 945 | 280 | None | 1 | 150 | ≦0.0001 |

Note:
"Doctor" denotes a molding pressure in doctor blade method.

TABLE 8

| Sample | | Material Composition (wt %) | | | | | Molding Pressure (MPa) | Sintering Condition Temp. × Time × Pres. (° C.) × (hr) × (atm) | Cooling Rate till 1500° C. after Sintering (° C./hr) | Porosity (%) |
|---|---|---|---|---|---|---|---|---|---|---|
| | | $Si_3N_4$ | Rare Earth Oxide | | MgO | Other Component | | | | |
| Example | 145 | 86.5 | $CeO_2$ | 12.5 | 1 | — — | 130 | 1850 × 8 × 5 | 50 | 0.3 |
| | 146 | 89.5 | $Y_2O_3$ $Er_2O_3$ | 3.5 6.5 | 0.5 | $HfO_2$ 2 | 130 | 1875 × 8 × 5 | 50 | 1 |
| | 147 | 89 | $Y_2O_3$ $Er_2O_3$ | 3.5 6.5 | 1 | — — | 130 | 1800 × 8 × 5 | 50 | 0.5 |
| | 148 | 89 | $Y_2O_3$ $Er_2O_3$ | 3.5 6.5 | 1 | $TiO_3$ 0.3 $HfO_2$ 2 | Doctor | 1850 × 8 × 5 | 25 | 0.1 |
| | 149 | 89 | $Y_2O_3$ $Er_2O_3$ | 3.5 6.5 | 1 | $TiO_2$ 0.5 | 130 | 1850 × 8 × 5 | 25 | 0.1 |
| C. Example | 101 | 95 | $Y_2O_3$ | 5 | — | — — | 120 | 1800 × 8 × 9 | 500 | 4.5 |
| | 102 | 94.5 | $Y_2O_3$ | 5 | 0.5 | — — | 100 | 1800 × 8 × 9 | 50 | 1.3 |
| | 103 | 94.5 | $Y_2O_3$ | 5 | 0.5 | — — | 120 | 1800 × 8 × 9 | 50 | 0.5 |
| | 104 | 94.5 | $Y_2O_3$ | 5 | 0.5 | — — | 120 | 1800 × 8 × 9 | 50 | 0.5 |

| Sample | | Crystal Phase Ratio to Grain Boundary Phase (Area Ratio) (%) | Thermal Conductivity (W/m · K.) | Three-Point Bending Strength (MPa) | Residual Carbon Content (ppm) | Micro-Crack | Number of Sub-micron Crack (/100 μm²) | Leak Current (nA) | Dielectric Loss 1 MHz |
|---|---|---|---|---|---|---|---|---|---|
| Example | 145 | 52 | 90 | 855 | 280 | None | 1 | 150 | ≦0.0001 |
| | 146 | 80 | 88 | 850 | 280 | None | 1 | 90 | ≦0.0001 |
| | 147 | 53 | 86 | 975 | 280 | None | 1 | 180 | ≦0.0001 |
| | 148 | 90 | 93 | 915 | 280 | None | 0 | 60 | ≦0.0001 |
| | 149 | 65 | 98 | 885 | 280 | None | 1 | 120 | ≦0.0001 |
| | 101 | 10 | 24 | 760 | 400 | Occur | 10 | 1200 | 0.003 |
| | 102 | 57 | 87 | 810 | 400 | None | 4 | 700 | 0.0008 |
| | 103 | 57 | 92 | 820 | 400 | Occur | 13 | 1400 | 0.004 |
| | 104 | 57 | 90 | 820 | 800 | None | 8 | 800 | 0.0005 |

Note:
1) "Doctor" denotes a molding pressure in doctor blade method.
2) C. Example denotes Comparative Example.

As is apparent from the results shown in Table 6 to Table 8, the silicon nitride ceramic circuit boards of the respective Examples, which were cooled at rates lower than the cooling rate in Comparative Example 101 immediately after the density-enhanced sintering process, had crystal phases formed in the grain boundary phases. In addition, as the silicon nitride ceramic substrate had a higher ratio of the crystal phase to the grain boundary phase, the generation of the leak current was small, and there could be obtained the ceramic substrate having a higher strength, higher thermal conductivity and better heat radiation characteristics.

Further, even if a high voltage of 1.5 kV was applied to the substrate, each of Examples exhibited the leak current value of 500 nA or less, thus providing excellent insulating property and withstand voltage characteristics. Furthermore, the dielectric loss of the substrate in a high frequency region of 1 MHz was 0.0001 or less in all Examples. Therefore, when this substrate is used to manufacture a module having a high power and high capacity, an excellent operative reliability and durability can be realized. Particularly, in the respective ceramic substrates, there exists a relationship that the dielectric loss is almost proportional to the frequency, so that the improvement in insulating property and reliability of the substrate further become remarkable.

Still further, in the respective examples containing a predetermined amount of Mg, the crystallization of the grain boundary is easily advanced thereby to relatively reduce the ratio of the glass phase, so that there can be obtained a silicon nitride substrate in which the generation of crack is few and having an improved thermal conductivity and a high strength.

Still furthermore, in the silicon nitride ceramic substrates of respective Examples in which the degreasing operation was sufficiently performed so as to reduce the residual carbon content in the resultant substrate to a range of 500 ppm or less, it was confirmed that the leak current became small and the substrate exhibited an excellent withstand voltage characteristics.

On the other hand, when the cooling rate of a sintered body was set to be high to rapidly cool the sintered body from the sintering temperature as in Comparative Example 101, a ratio of crystal phase in the grain boundary phase was low to be 10% or less, and the thermal conductivity was reduced to an undesired level. In addition, the ratio of the glass phase in the grain boundary phase was relatively increased, so that the leak current value was also increased.

Further, when the molding pressure was set to a lower level as in Comparative Example 102, the crack generation and the leak current value were increased thereby to deteriorate the insulating property. Furthermore, when a silicon nitride material powder containing a large amount of aforementioned impurity cationic elements, that is, 0.6% by weight, was used as in Comparative Example 102, almost grain boundary phase was formed to be amorphous although the cooling rate was set to the same as in Example 101, thereby relatively reducing the thermal conductivity.

Furthermore, in a case where the ceramic substrate prepared by sintering was subjected to a grinding treatment to control the thickness to a predetermined value as in Comparative Example 103, cracks were liable to occur due to an impact force caused by the grinding treatment, so that it was confirmed the leak current was increased and the withstand voltage characteristic of the substrate was disadvantageously lowered.

In this regard, the ceramic circuit board using the silicon nitride ceramic substrate according to the present invention is not limited to the configuration in which the metal circuit plate is bonded to both surfaces of the ceramic substrate. It goes without saying that there can be also adopted a configuration in which the metal circuit plate is bonded to only the front surface of the substrate; or a configuration in which the metal circuit plate is bonded to the front surface of the substrate while a heat sink or another metal plate for preventing warp and deformation of the circuit board is bonded to the rear surface of the substrate.

As described above, according to the silicon nitride ceramic substrate and the manufacturing the same of the present invention, the ceramic substrate is manufactured in such a manner that the molded compact is subjected to a predetermined holding treatment on the way to the sintering step, thereafter sintered, so that the oxygen content in the sintered body is reduced and the generation of the pore is effectively suppressed thereby to enable the maximum pore size to be extremely small. Therefore, there can be obtained a silicon nitride ceramic substrate having a high insulating property and less leak current formation.

Therefore, in a case where a power module is manufactured by using the above silicon nitride ceramic substrate, even if the output power and the capacity of the module are increased, there can be formed a power module having a high insulating property and a high reliability in operative function.

What is claimed is:

1. A silicon nitride ceramic substrate composed of a silicon nitride sintered body in which a maximum size of pore existing in grain boundary phase of the sintered body is 0.3 μm or less, and having a thermal conductivity of 50 W/mK or more and a three point bending strength of 500 Mpa or more, wherein a leak current is 1000 nA or less when an alternating voltage of 1.5 kV/100 Hz is applied to a portion between front and back surfaces of the silicon nitride body under conditions of a temperature of 25° C. and a relative humidity of 70%.

2. The silicon nitride ceramic substrate according to claim 1, wherein said silicon nitride ceramic substrate has a fracture toughness of 6.5 MPa·m$^{1/2}$ or more.

3. The silicon nitride ceramic substrate according to claim 1, wherein said silicon nitride ceramic substrate comprises a silicon nitride crystal phase and a grain boundary phase, and having a ratio of a crystal compound phase comprising a sintering agent and formed in the grain boundary phase to the entire grain boundary phase of at least 20%.

4. The silicon nitride ceramic substrate according to claim 1, wherein said silicon nitride ceramic substrate contains 2.0 to 17.5% by weight of a rare earth element in terms of the amount of oxide thereof.

5. The silicon nitride ceramic substrate according to claim 1, wherein said silicon nitride ceramic substrate has a thickness of 1.5 mm or less.

6. The silicon nitride ceramic substrate according to claim 1, wherein said silicon nitride ceramic substrate has a thermal conductivity of 90 W/mK or more.

7. The silicon nitride ceramic substrate according to claim 1, wherein said silicon nitride ceramic substrate contains 0.3 to 3.0% by weight of Mg in terms of amount of MgO.

8. The silicon nitride ceramic substrate according to claim 1, wherein said silicon nitride ceramic substrate contains 0.3 to 3.0% by weight of at least one of Hf and Mg in terms of the amount of oxide thereof, and at most 0.5% by weight of Al, Li, Na, K, Fe, Ba, Mn and B as impurity cationic elements in terms of total amount thereof.

9. The silicon nitride ceramic substrate according to claim 1, wherein said silicon nitride ceramic substrate contains at most 2% by weight of at least one element selected from the group consisting of Ti, Zr, W, Mo, Ta, Nb, V and Cr in terms of oxide thereof.

10. A silicon nitride ceramic circuit board comprising:
   a silicon nitride ceramic substrate as set forth in any one of claims 1 to 8 and 9; and a metal circuit plate provided on said silicon nitride ceramic substrate.

11. A method of manufacturing the silicon nitride ceramic substrate of claim 1, comprising the steps of:
   preparing a material mixture by adding 2.0 to 17.5% by weight of a rare earth element in terms of the amount of an oxide thereof to a silicon nitride powder;
   molding said material mixture to form a compact;
   degreasing said compact;
   heating and holding said compact at a temperature of 1,300–1,600 C. for a predetermined period of time on the way to a sintering step;
   sintering the compact at a temperature of 1,700–1,900° C. thereby to form a sintered body; and
   moderately cooling the sintered body at a cooling rate of at most 100° C. per hour until the temperature is reduced to a point at which a liquid phase formed by the rare earth element during the sintering step solidifies.

12. The method of manufacturing a silicon nitride ceramic substrate according to claim 11, wherein said silicon nitride powder contains at most 1.5% by weight of oxygen, at most 0.5% by weight of Al, Li, Na, K, Fe, Ba, Mn and B as impurity cationic elements in terms of total amount thereof, and 75 to 97% by weight of alpha-phase type silicon nitride, and which has an average grain size of at most 1.0 μm.

13. The method of manufacturing a silicon nitride ceramic substrate according to claim 11, wherein 0.3 to 3.0% by weight of at least one of Hf and Mg in terms of oxide thereof is added to said silicon nitride powder.

14. The method of manufacturing a silicon nitride ceramic substrate according to claim 11, wherein at most 2% by weight of at least one element selected from the group consisting of Ti, Zr, W, Mo, Ta, Nb, V and Cr in terms of oxide thereof is added to said silicon nitride powder.

15. The method of manufacturing a silicon nitride ceramic substrate according to claim 11, wherein said material mixture is molded at a molding pressure of 120 MPa or more thereby to form said compact.

16. The method of manufacturing a silicon nitride ceramic substrate according to claim 15, wherein said molding pressure is within a range of 120–200 MPa.

17. The method of manufacturing a silicon nitride ceramic substrate according to claim 11, wherein a residual carbon content in said silicon nitride sintered body after the sintering step is 500 ppm or less.

* * * * *